United States Patent [19]
Fang et al.

[11] Patent Number: 5,606,518
[45] Date of Patent: Feb. 25, 1997

[54] TEST METHOD FOR PREDICTING HOT-CARRIER INDUCED LEAKAGE OVER TIME IN SHORT-CHANNEL IGFETS AND PRODUCTS DESIGNED IN ACCORDANCE WITH TEST RESULTS

[75] Inventors: Hao Fang, Cupertino; Peng Fang, Milpitas; John T. Yue, Los Altos, all of Calif.

[73] Assignee: Advanced Micro Devices, Inc., Sunnyvale, Calif.

[21] Appl. No.: 442,320

[22] Filed: May 16, 1995

Related U.S. Application Data

[62] Division of Ser. No. 101,251, Aug. 2, 1993.

[51] Int. Cl.$^6$ .................... G01R 19/145; G01R 31/28
[52] U.S. Cl. .................... 364/578; 364/488; 364/489; 364/483
[58] Field of Search .................... 364/578, 483, 364/580, 488, 489, 490, 481

[56] References Cited

U.S. PATENT DOCUMENTS

| | | | |
|---|---|---|---|
| 4,382,229 | 5/1983 | Cottrell et al. | 324/158 |
| 4,520,448 | 5/1985 | Tremintin | 364/484 |
| 4,542,340 | 9/1985 | Chakravarti et al. | 324/158 R |
| 4,789,825 | 12/1988 | Carelli et al. | 324/158 T |
| 4,906,921 | 3/1990 | Juge | 324/158 R |
| 5,012,306 | 4/1991 | Tasch, Jr. et al. | 357/23.4 |
| 5,093,275 | 3/1992 | Tasch, Jr. et al. | 437/41 |
| 5,153,510 | 10/1992 | Kominsky | 324/99 D |
| 5,381,345 | 1/1995 | Takegami et al. | 364/491 |

OTHER PUBLICATIONS

Kriese et al., "MOSFET Hot Electron Effect Characterization," IBM Corp., 1976, pp. 2119–2120.

Phillips, Jr. et al., "IGFET Hot Electron Emission Model," 1975 IEDM Digest Paper 3.3, pp. 39–42.

Acovic et al., "Characterization of Hot Electron Stressed MOSFET's by Low Temp. Measurements of the Drain Tunnel Current," IEEE, 1990 pp. 1467–1476.

Fang et al., "Hot Carrier Induced Off State Current Leakage in Submicrometer, PMOSFET Devices," IEEE, 1994, pp. 463–465.

*Primary Examiner*—Kevin J. Teska
*Assistant Examiner*—Thai Phan
*Attorney, Agent, or Firm*—Fliesler, Dubb, Meyer & Lovejoy

[57] ABSTRACT

A test method and apparatus are provided for predicting hot-carrier induced leakage over time in IGFET's. Test results are used to show how choice of channel length and stress voltages critically affect hot-carrier-induced leakage (HCIL) leakage over time, particularly in devices having submicron channel lengths. Models are developed for predicting leakage current over the long term given short term test results. Alternative design strategies are proposed for reliably satisfying long term leakage requirements.

19 Claims, 15 Drawing Sheets

TEST METHOD FOR PREDICTING HOT-CARRIER INDUCED LEAKAGE OVER TIME IN SHORT-CHANNEL IGFETS AND PRODUCTS DESIGNED IN ACCORDANCE WITH TEST RESULTS

This application is a division of Ser. No. 08/101,251, filed Aug. 2, 1993.

BACKGROUND

1. Field of the Invention

The invention is directed generally to Insulated Gate Field Effect Transistors (IGFETs). The invention is more specifically directed to a method for predicting the amount of leakage current which will occur over time in IGFETs and systems fabricated with IGFET's as a result of a hot-carrier induced leakage mechanism. The invention is also more specifically directed to a method for designing high-density, low-power, IGFET-based integrated circuits so that the circuits will reliably meet life-time leakage specifications despite their tendency to leak more current as post-manufacture utilization time increases.

2. Cross Reference to Related Documents

The following documents are believed relevant to the below discussion and are incorporated herein by reference:

(A) Peng Fang et al., "A Method to Project Hot Carrier Induced Punchthrough Voltage Reduction for Deep Submicron LDD PMOS FETs at Room and Elevated Temperatures," International Reliability Physics Symposium, pp. 131–135, March 1992.

(B) Mitsumasa Koyanagi et al., "Hot-Electron Punchthrough (HEIP) Effect in Submicrometer PMOSFET's," IEEE Trans. Electron Devices, Vol. ED-34, No. 4, April 1987, pp 839–844.

3. Description of the Related Art

The phenomenon of punchthrough voltage reduction due to hot-carrier injection of charged particles into the gate oxide of IGFETs is known in the art. (See above cited IRPS paper by P. Fang et al.)

In brief, the phenomenon unfolds during post-manufacture utilization. When a field effect transistor (FET) is held in a turned-on state (conductive state), charge carriers move through a channel region of the transistor from a source region to a drain region. The moving charge carriers gain more and more energy as they come closer and closer to the drain region. Some of the highly-energized charge carriers that are approaching the drain region collide with nuclei of the channel region and generate electron-hole pairs or other ionized anomalies. Due to the distribution of electric fields near the drain, the electron and hole of each collision-induced electron-hole pair tend to separate from one another and preferentially migrate towards or away from the gate of the device. Some of the migrating charge-particles become trapped in the gate insulating layer that separates the gate from the channel or at the interface of the gate insulating layer and the channel.

When a turn-off voltage is later applied to the gate of the same transistor for the purpose of switching the transistor into an off state, it is expected that no current will flow through the device. However, the charged particles which have collected over time and become trapped at the channel/gate-insulator interface, or within the gate insulating layer, reduce the effective channel length. This in turn reduces the punchthrough voltage ($V_{pt}$) of the device. Operation at or above the punchthrough level induces an undesirable flow of leakage current between the source and drain. Such leakage current, when it occurs due to operation at or slightly above the punchthrough level, is typically on the order of one or less microampere ($\leq 1$ μA) per transistor and is rarely thought to be of consequence when one considers a circuit having only a few transistors.

However, modern integrated circuit designs usually call for the inclusion of millions of transistors on a single monolithic substrate. A leakage current of just one nanoampere (1 nA) per transistor translates into a larger scale leakage current of one or more milliamperes ($\leq 1$ mA) per integrated circuit (IC) chip in high-density designs that sport millions of transistors per IC chip. This magnitude of leakage is generally unacceptable in low-power environments. It is particularly unacceptable when the IC chip is one of many like-leaking devices, all residing in a system that is supposed to have very low power consumption.

An example of such a power-frugal system is a portable "notebook" or "palmtop" computer that is to be powered by a battery of limited amp/hours. It is common to require such a computer to have one or more power-conserving standby modes in which the power consumption of inactive computing resources is minimized by putting them to "sleep". This helps to extend the operating time of the computer after each battery charge. Mobile systems such as hand-carried, or in-vehicle cellular telephones constitute another example of systems are typically required to be power-frugal.

Circuit designers need to have a clear understanding of not only what the punchthrough voltage of each IGFET is, but also a quantitative appreciation of the total amount of leakage current that will be drawn by each IC chip in a low-power standby mode. They also need to have a clear understanding of how each design choice exacerbates or mitigates leakage over time so that they may intelligently produce a low-power design that remains so over a specified system lifetime.

System lifetimes are typically specified as being at least 1 year to 3 years in order to satisfy consumer warranty requirements, and more often as being at least 5 to 10 years, to satisfy market requirements. The required lifetime of a given system can, of course, be much longer. It is often required, or at least desirable, to keep the power consumption of circuits that are in low-power standby mode below a specified maximum during the specified lifetime of the system.

Unfortunately, IGFET's are subject to degradation mechanisms which can increase their off-state leakage current and thereby make it is difficult to guarantee low power consumption over a one year or longer lifetime. In particular, it is to be expected that hot-carrier-induced leakage will increase over time because more and more charged particles become trapped by the gate insulating layer as device utilization time accumulates and effective channel length decreases.

There has been little investigation to date of the quantitative interrelation between design parameters and the rate at which leakage current increases over time as a result of post-manufacture utilization. The integrated circuit industry has been rushing forward to designs of smaller and smaller channel lengths, and through this path, to designs of ever higher integration densities, with little regard to the kinds of leakage problems that may develop as channel lengths become smaller and smaller.

A sound methodology is needed for accurately predicting the amount of leakage that will be seen over the operational lifetime of a new system (which lifetime is usually specified as 5–10 years). This is particularly so in cases where a planned system is to employ millions of insulated gate field effect transistors (IGFET's) each having a channel length in the submicron ($\leq 1$ μm) or deep-submicron ($\leq 0.5$ μm) range.

SUMMARY OF THE INVENTION

The invention provides a test fixture, a test method and a methodology for predicting hot-carrier induced leakage (HCIL) over time through insulated gate field effect transistors (IGFET's) and systems employing such devices.

Test results are used to show how choice of channel length critically affects hot-carrier-induced leakage (HCIL) over time, particularly in devices having submicron or smaller channel lengths. Alternative design strategies are proposed for reliably satisfying long term leakage requirements.

In brief, the invention may be characterized as including at least the following features: (1) a test system that is to be used for characterizing long-term leakage in new submicron technologies; (2) a software modeling package for modeling leakage through submicron designs; (3) a fabrication line monitoring and correction system; and (4) an interactive design system for designing submicron circuits in view of discovered leakage characteristics. The last category (4) may be subdivided into: (4a) a design system for setting submicron fabrication parameters, and (4b) a design system for setting higher level circuit parameters to offset fabrication-inherent leakage problems. These features may be summarized in more depth as follows.

A test-fixture in accordance with the invention comprises: (a) connection means for connecting to a source, drain, gate and substrate of an insulated gate field effect transistor that is to be tested; (b) connection reversing means for reversing the source and drain connections; (c) adjustable voltage establishing means for establishing adjustable voltage levels at the connections to the source, drain, gate and substrate of the transistor under test, the voltages being adjustable to define at least, (c.1) a conductive but nondestructive stress state for the transistor under test, in which a charge trapping mechanism is activated within the transistor, and (c.2) a nondestructive leakage measurement state in which a turn-off voltage is applied to a gate of the transistor for the purpose of measuring current leakage through the transistor under worst-case or other conditions; (d) state alternating means for alternating the state of the transistor under test between the conductive stress state (c.1) and the nondestructive, leakage measurement state (c.2); (e) accumulated stress time measuring means for measuring, at the-time of each leakage measurement, the accumulated amount of time for which the transistor under test has been in the conductive stress state (c.1); (f) leakage measurement means for measuring forward and reverse current leakage through the transistor under test; and (g) data recording means for recording data indicating a quantitative correlation between accumulated stress time and measured forward and reverse leakage.

A test method in accordance with the invention comprises the steps of: (a) repeatedly switching an insulated gate field effect device that has a given channel length and other design specified attributes (e.g., doping profile, on-state stress voltages, etc.) between a conductive stress state in which charge trapping is induced within the device, and a nondestructive leakage measurement state in which a turn-off voltage is applied to a gate of the device for the purpose of measuring current leakage through the device; (b) repeatedly measuring the accumulated amount of time for which the device has been in the conductive stress state; (c) measuring forward and/or reverse current leakage through the device in each of the repeated leakage measurement states; (d) recording data indicating a quantitative correlation between accumulated stress time and measured forward and/or reverse leakage; (e) repeating above test steps (a) through (d) for another insulated gate field effect device that has a another channel length and/or another design attribute (e.g., a different doping profile, different on-state stress voltages, etc.); and (f) recording data indicating the quantitative correlation between changes in the channel length or changes in the other altered design attribute(s) of the tested plurality of insulated gate field effect devices versus measured forward and/or reverse leakage for various, accumulated stress times.

A leakage predicting method in accordance with the invention comprises the steps of: (a) performing the above test method on insulated gate devices of differing designs for a sufficiently long period of time to generate trend data for each design indicating a quantitative trend over time for change in leakage current as a result of hot-carrier-induced alteration of the gate insulation layer in each tested device; (b) fitting a prediction curve to the recorded test data of each design for predicting leakage beyond the time of the test; and (c) extending the prediction curve of each design beyond the period of time of the test and using the extended portion to quantitatively predict future leakage (e.g., 5 to 10 years later) in devices built and used according to each design.

A leakage-mechanism modeling method in accordance with the invention provides a quantitative prediction of leakage through an insulated gate device as a function of accumulated stress time and at least one design parameter selected from a design parameter group that includes but is not limited to: (a) channel length; (b) drain voltage during the stress state ($V_{Dstress}$); (c) gate voltage during the stress state ($V_{Gstress}$); (d) drain voltage during the turn-off state ($V_{Dop}$); (e) gate voltage during the turn-off state ($V_{Goff}$); (f) channel doping concentration or channel doping profile; (g) gate insulator composition or thickness; (h) source and/or drain junction depth; and (i) a plasma-control parameter set during plasma-etch definition of gate width, which parameter affects plasma density and/or uniformity across a wafer, the plasma-control parameter being one such as plasma bias, magnetic field strength/distribution or concentration of specific chemicals within the plasma. Such a leakage-mechanism modeling method comprises the steps of: selecting one of the above design parameters; performing the above-mentioned leakage prediction method such that the difference between the differing designs is defined by at least three variations of the one selected design parameter; and finding a mathematical formula or curve which conforms, within a user-defined level of acceptable error, to the results obtained for the at least three variations and which defines leakage as a function of accumulated stress time and the one selected design parameter. The modeling method can, of course, be repeated while selecting a different design parameter each time so as to develop more complex mathematical formulas or curves that provide a quantitative prediction of leakage through the insulated gate device as a function of accumulated stress time and two or more design parameters.

A design and implementation process in accordance with the invention comprises the steps of: (a) simulating device operations over time within a simulated target circuit while using the prediction model of the above leakage-mechanism modeling method to model leakage due to applied stress voltages and accumulated stress time; (b) determining from the simulating step the amount of leakage to be expected over a prespecified lifetime of the device; (c) and in the case where the determined leakage exceeds a prespecified maximum, varying the simulated channel length or varying another design parameter (e.g., doping profile) of the device or varying the simulated operating environment of the device and repeating design steps (a) through (c) until a suitable channel length and/or other design attribute is found for preventing leakage from exceeding the prespecified maximum over the specified device lifetime; and thereafter (d) fabricating the device with the channel length and/or other design attribute found in above step (c).

A fabrication line monitoring method in accordance with the invention comprises the steps of: (a) defining a nominal leakage predictor for predicting as a function of accumulated stress time and applied stress voltages, the amount of leakage current that will flow through a nominal insulated gate device having a prespecified nominal channel length and other prespecified, nominal fabrication-defined attributes; (b) fabricating a plurality of sample devices on a fabrication line that is designed to produce each sample with the prespecified nominal channel length and other prespecified, nominal fabrication-defined attributes, where the fabrication line is subject to process variations; (c) testing each fabricated sample according to the above-mentioned stress-and-measure test method; and (d) comparing the test results of each sample against the results predicted by the nominal leakage predictor so as to identify for cases where substantial differences are found, the variation in the fabrication-defined channel length or other attribute of the samples (e.g. variation away from nominal in channel length or other attribute) that explains the observed difference between the leakage results predicted by the nominal predictor and the actual results found by the stress-and-measure tests when carried out over an empirically-determined length of accumulated stress time.

A fabrication line correction method according to the invention uses the above monitoring method to determine deviations of sample channel length away from the nominal and feeds the deviation amount back to a channel-length defining portion of the fabrication line for feedback style correction.

BRIEF DESCRIPTION OF THE DRAWINGS

The below detailed description makes reference to the accompanying drawings, in which.

DETAILED DESCRIPTION

Figure 1A:
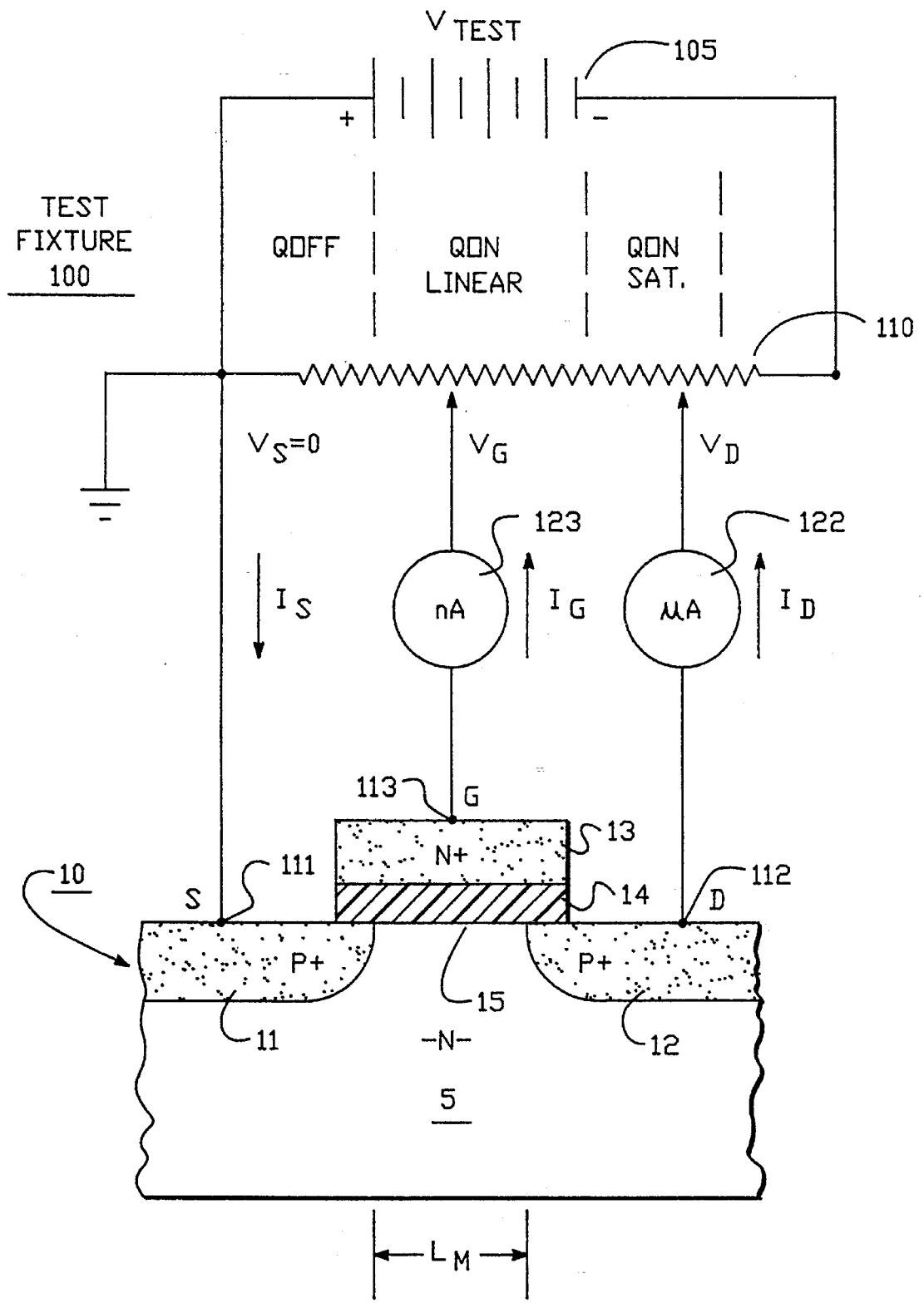
FIG. 1A is a schematic diagram of a conventional test fixture for measuring device characteristics.

FIG. 1A provides a schematic diagram of a conventional test fixture 100 that has been used in the past for testing the leakage characteristics of Insulated Gate Field Effect Transistors (IGFET's). The illustrated transistor under test, 10, is not part of the test fixture 100 and is not necessarily a conventional transistor. Oftentimes, a novel transistor will be characterized for the first time by the test fixture 100 to see how the transistor 10 behaves under various stress conditions.

Fixture 100 includes a voltage supply 105 for generating a desired range of voltages, 0 to $V_{test}$. A source contact (S) 111, a drain contact (D) 112, and a gate contact (G) 113 are provided for making respective contact with the source, drain and gate of the transistor under test 10. The source contact 111 is tied to ground.

A voltage adjusting means 110 is provided for setting each of the gate voltage $V_G$ and drain voltage $V_D$ to a desired level within the available range of test voltages (0 to $V_{test}$). For the sake of simplicity, the voltage adjusting means 110 is shown as a potentiometer with two wiper arms, one providing the gate voltage $V_G$ and the other providing the drain voltage $V_D$. It will be understood by those skilled in the art that other methods for adjusting $V_G$ and $V_D$ relative to source voltage $V_S$ may be used. The potentiometer wiper arm that defines gate voltage $V_G$ can be swept through three voltage ranges respectively marked as $Q_{off}$ to represent a range in which transistor 10 is supposed to be switched off; $Q_{on-linear}$ to represent a range in which transistor 10 is supposed to be in a switched-on linear mode; and $Q_{on-sat}$ to represent a range in which transistor 10 is supposed to be in a switched-on saturated mode.

Test fixture 100 further includes a first current meter 122 for measuring drain current $I_D$ and a second current meter 123 for measuring gate current $I_G$. The first current meter 122 generally measures current on the scale of microamperes (μA). The second current meter 123 typically measures current on a much finer scale such as nanoamperes (nA), or picoamperes (pA).

The transistor under test 10 is shown by way of example as being a P-channel MOSFET formed on a monocrystalline silicon substrate. Transistor 10 has a bulk N type region 5, a P+ source region 11 defined at and below the substrate surface, a P+ drain region 112 also defined at and below the substrate surface and a lightly doped N-type channel region 15 having a manufactured channel length of $L_M$ interposed between the source and drain regions, 11 and 12. A gate insulating layer 14 formed for example of 150 Angstrom thick thermally grown oxide supports an N+ doped polysilicon gate layer 13 over the channel region 15.

The particular transistor 10 shown in FIG. 1A is known as a "buried channel" transistor because current flow through channel region 15 occurs below the oxide/silicon interface of layers 14 and 15 when the transistor is turned on. This occurs due to the differential N+ doping of the gate layer 13 and the P+ doping of the source-drain regions 11–12. (N+ doping of the gate layer 13 is often employed to reduce fabrication complexity and cost. It is performed at the same time that the gate of a nearby NMOS transistor (not shown) is also doped to have an N+ conductivity type.)

Although the below discussion examines the leakage mechanisms of the illustrated, buried channel PMOS transistor 10, it is to be understood that leakage mechanisms of similar effect can afflict other types of insulated gate field effect devices, including surface channel NMOS transistors.

Figure 1B:
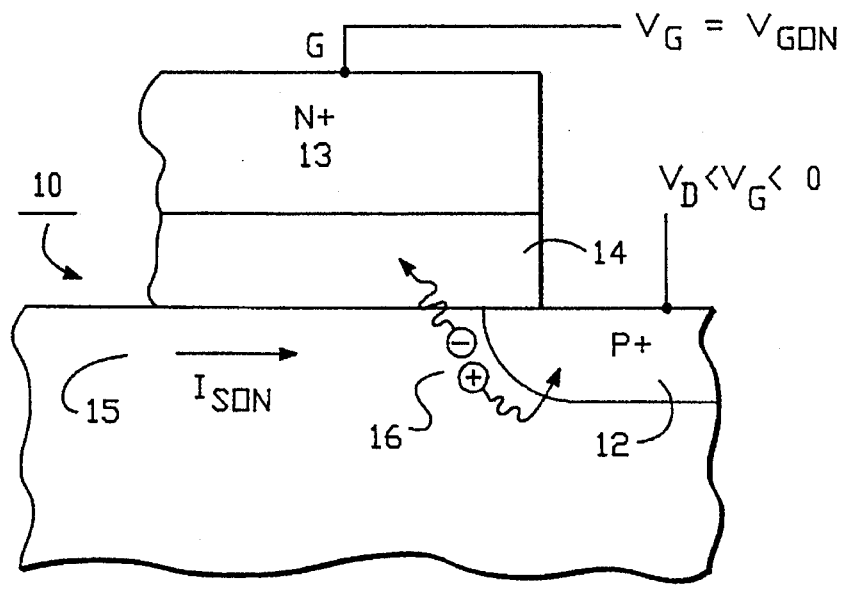
FIG. 1B is a cross sectional view showing impact ionization during a conductive on-state of the transistor-under-test that is shown in FIG. 1A.

Referring to FIG. 1B, a phenomenon of special interest here is a so-called "hot-carrier-induced leakage" effect (HCIL) which is known to degrade the switching performance over time of FET's in general, and particularly that of PMOS transistors.

When PMOS transistor 10 is switched into a conductive state during usage ($V_G$ is in the $Q_{on\text{-}linear}$ or $Q_{on\text{-}sat}$ range), a current $I_{SON}$ of energized charge carriers (holes) moves through the channel region 15 from the source region 11 to the drain region 12. Impact with silicon atoms near the channel/drain juncture generates electron-hole pairs 16. The impact-produced holes migrate to the usually more-negative drain region 12 while the impact-produced electrons migrate toward the usually less-negative gate layer 13. (The relation between voltages in the turned-on state of the PMOS transistor is usually, $V_D<V_G<0$ and $V_S=0$.) Some of the impact-produced electrons pass completely through the insulating layer 14 due to tunneling or other leakage mechanisms and are collected by the gate layer 13. This passage can be measured during device characterization as a small flow of gate current $I_G$ seen on second current meter 123 (FIG. 1A).

Figure 1C:
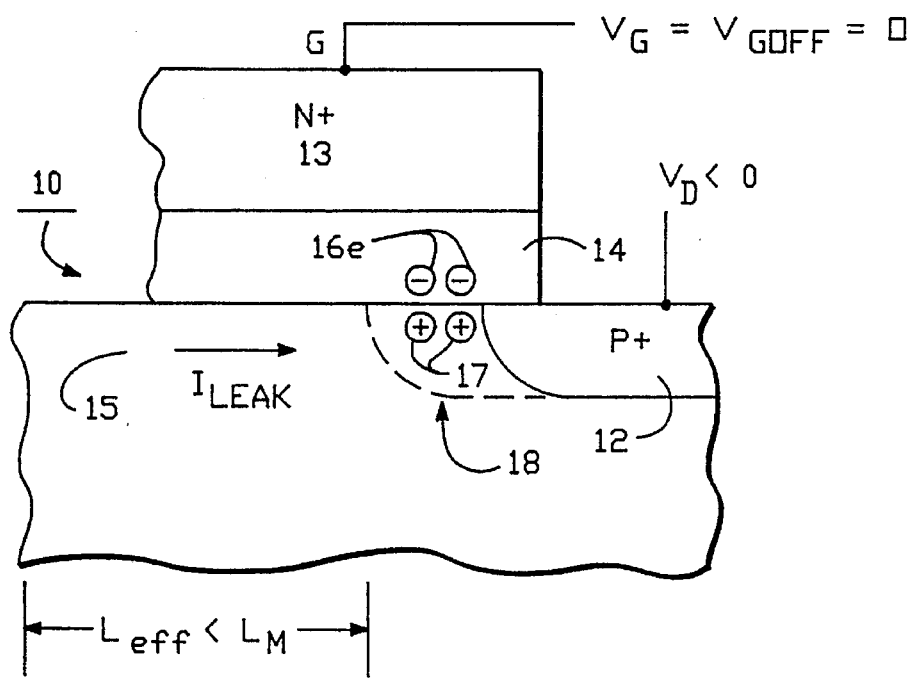
FIG. 1C is a cross sectional view showing channel shortening as a result of ion trapping within the gate insulating layer of the transistor-under-test that is shown in FIG. 1A.

Some of the impact-produced electrons 16e become trapped within the insulating layer 14 or become trapped at the channel/insulator interface 15/14 as shown in FIG. 1C. When a turn-off gate voltage $V_G=V_S=0$ V is later applied to the same transistor 10 (FIG. 1C), the trapped electrons 16e attract holes 17 to the channel side of the channel/insulator interface 15/14 (silicon/oxide interface). These holes 17 have the effect of shifting the effective boundary of the P+ drain region 12 closer to the source region, as indicated by dashed line 18 and thereby shortening the effective channel length $L_{eff}$ to be less than the post-diffusion manufactured length $L_M$. (Note: the term "effective channel length" is sometimes used in the industry to refer only to the manufactured length $L_M$ which develops after lithography and dopant diffusion, as opposed to the "drawn" channel length which appears on a chip layout. The term "$L_{eff}$" is used differently here to denote the effective channel length resulting from further channel shortening due to hot-carrier induced charge trapping.)

Depending on the number and distribution of trapped electrons 16e, channel shortening tends to produce two detrimental effects. First, by reducing the effective channel length $L_{eff}$, it reduces the potential barrier (typically drawn on an energy band diagram) between the source and drain while a turn-off voltage is applied to the transistor. This tends to disadvantageously decrease the punchthrough voltage point of the transistor. It also works to reduce the threshold voltage at which the onset of leakage current is seen. The reduction of punchthrough voltage was reported in the above cited paper, "A Method to Project Hot Carrier Induced Punchthrough Voltage Reduction for Deep Submicron LDD PMOS FETs at Room and Elevated Temperatures," by Peng Fang et al.

Second, and more importantly, when a sufficient number of trapped electrons 16e distribute over the manufactured length $L_M$ of the channel region 15, the so-called "hot-carrier induced leakage" mechanism (HCIL) comes into effect and allows a relatively large leakage current $I_{LEAK}$ to flow through the transistor even though the gate voltage $V_G$ is adjusted to a turn-off level ($V_G$ is in the $Q_{off}$ range). This leakage current $I_{LEAK}$ becomes a problem, as explained earlier, when large numbers of transistors are to be switched off in parallel during a low-power standby mode.

Figure 2:
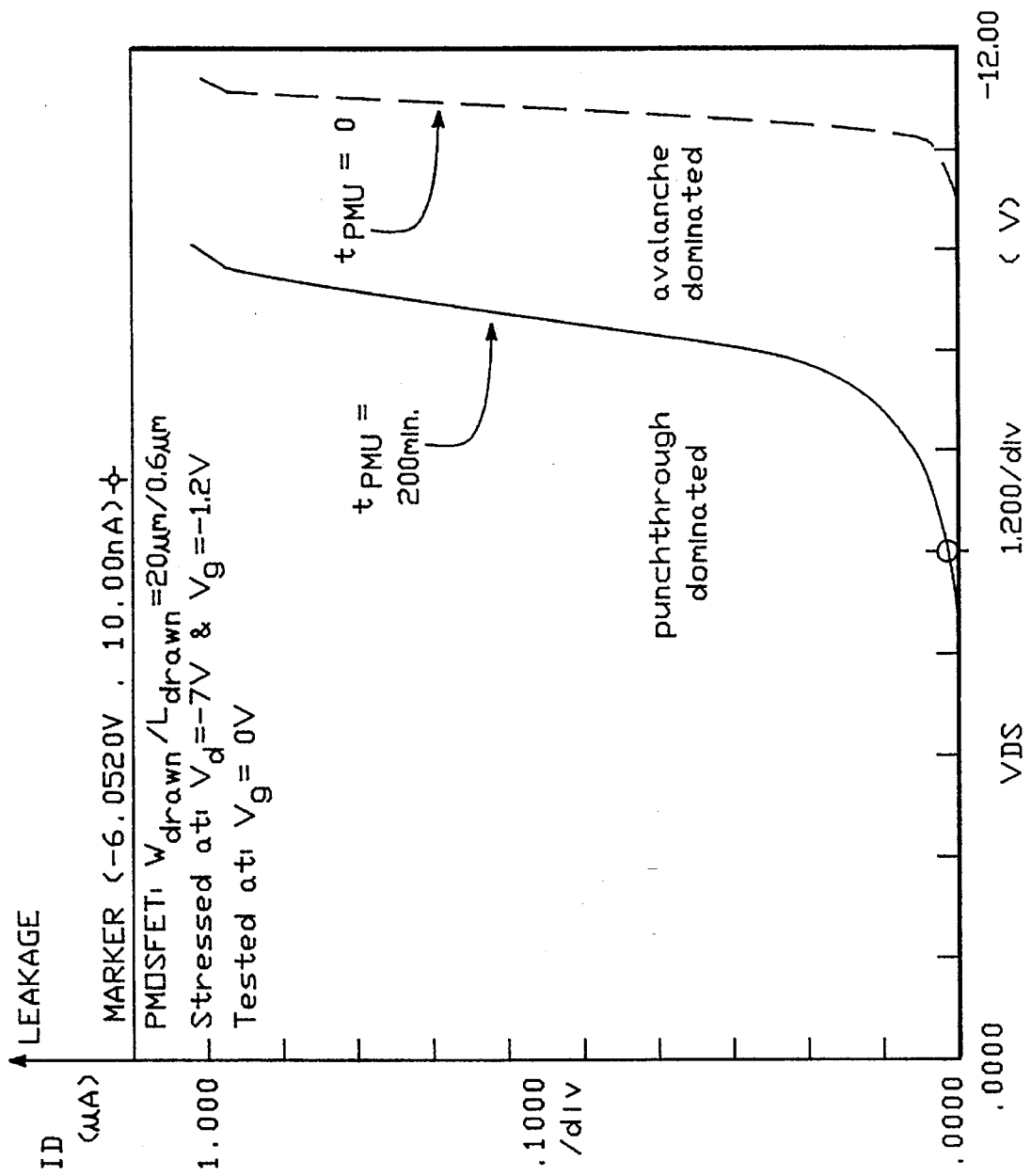
FIG. 2 is a graph showing leakage increase over time.

FIG. 2 is a plot of leakage current versus drain voltage for a particular PMOSFET which was tested in the conventional test fixture 100 of FIG. 1A. The transistor, which had drawn width and length dimensions of 20 μm and 0.6 μm respectively, was subjected to the following test procedure.

Immediately after manufacture, the gate voltage $V_G$ of the transistor was set to 0 V (a turn-off level) and the drain voltage $V_D$ was swept progressively from 0 V towards −12 V. Drain current was monitored by means of the first current meter 122. The results of this sweep are represented by the dashed line labeled $t_{PMU}=0$ (post-manufacture utilization time equals zero). No significant leakage current was found until the drain voltage $V_D$ went beyond −9 V and then leakage current increased exponentially to one microampere (1 μA) as the drain voltage approached closer to −12 V. The current measurement was halted at this point.

Next, the same transistor was held in a conductive state with $V_D$ set to −7 V and $V_G$ set to −1.2 V. The latter setting of the gate voltage was picked by adjusting $V_G$ until a maximum amount of gate current $I_G$ was detected by second current meter 123. This state of maximum $I_G$ for a given $V_D$ is referred to here as the "maximum stress" state of the transistor. It is believed that this state produces trapped electrons 16e (FIG. 1C) at a maximum accumulation rate, given the preset drain voltage, $V_{D=}-7$ V.

The maximum stress state for $V_D=-7$ V was maintained for 200 minutes and then $V_G$ was reset to 0 V and the test of sweeping the drain voltage $V_D$ progressively from 0 V towards −12 V was again performed. The results of this second sweep are represented by the solid curve labeled $t_{PMU}=200$ min. As seen, leakage begins much earlier in the 0 to −12 V range, and even at $V_D$ equals −6 V, one sees a leakage current of approximately 10 nanoamperes (nA).

The dashed curve of FIG. 2 is labeled "avalanche-dominated" because it is believed that this leakage is predominately generated by an avalanche breakdown mechanism. The solid curve of FIG. 2 is labeled "punchthrough dominated" because it is believed that this leakage result is mainly produced by a hot-carrier induced, punchthrough mechanism resulting from the accumulation of electrons 16e which became trapped in the gate oxide layer 14 during the 200 minute stress state.

It was proposed that the leakage problem would become much worse if the maximum stress state had been maintained for a longer period of time or if the drawn length of the channel had been decreased. The results of FIG. 2 did not provide adequate means for precisely predicting how much worse the leakage problem would become if the maximum stress state were to have been maintained for longer periods of time (e.g., 5 or 10 years as opposed to just 200 minutes). Moreover, the results of FIG. 2 did not provide adequate means for precisely predicting how much worse or better the leakage problem would become if the channel length were to be changed.

It was further proposed that the results of the solid curve of FIG. 2 may not accurately reveal the "hot-carrier induced, punchthrough dominated" leakage because the first sweep of $V_D$, which produced the dashed "avalanche dominated" leakage curve may have also produced irreversible damage to the crystal structure of the transistor under test when that transistor was stressed into an avalanche breakdown mode of relatively high current density. This type of stress is normally not encountered in operational circuits.

NEW TEST FIXTURE

Figure 3:
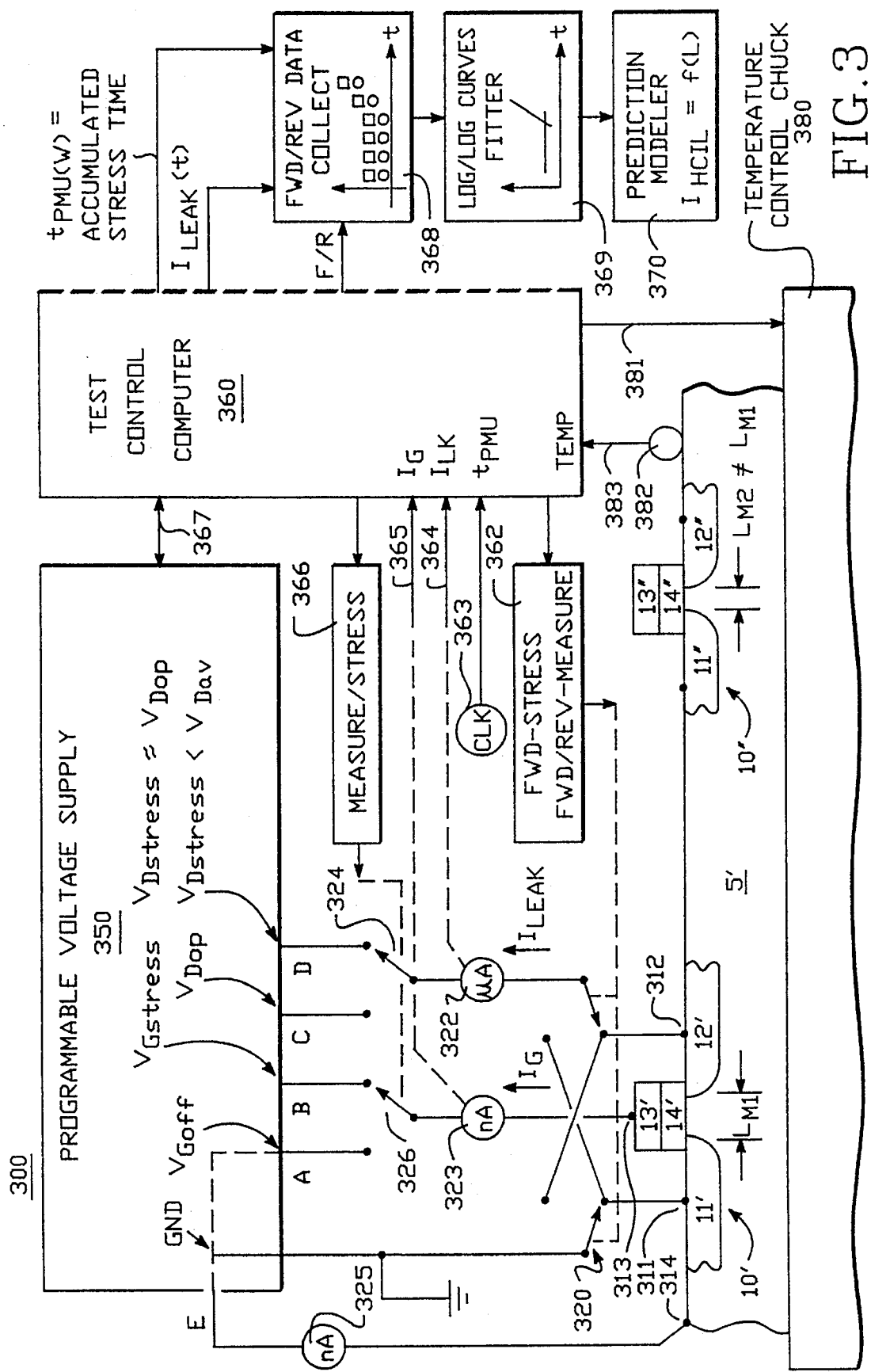
FIG. 3 is a schematic diagram of a test fixture in accordance with the invention.

With these proposals and questions in mind, the present inventors devised the test fixture 300 shown in FIG. 3. Since many of the elements in FIG. 3 are similar to those already described for FIG. 1A, like reference numerals in the "300" number series are used to denote similar but not necessarily identical elements.

Fixture 300 has probes 311, 312, 313 and 314 for making connection with respective source, drain, gate, and bulk-substrate regions of a transistor under test 10'. A computer-actuated, connection reversing switch 320 is provided for electrically reversing the source and drain terminal connections. A computer-readable drain current meter 322 is provided for measuring leakage current $I_{LEAK}$. A computer-readable gate current meter 323 is provided for measuring gate current during stress. A computer-readable substrate current meter 325 is further provided as shown for measuring substrate current ($I_{SUB}$).

A programmable voltage supply 350 is further provided for generating five voltage levels, $V_{Goff}$, $V_{Gstress}$, $V_{Dop}$, $V_{Dstress}$ and $V_{SUB}$ at five respective output terminals A, B, C, D, E of the programmable voltage supply 350. A computer-actuated gate switch 326 is provided for switching the gate voltage $V_G$ to either the $V_{Goff}$ level of supply terminal A or the $V_{Gstress}$ level of supply terminal B. A computer-actuated drain switch 324 is provided for switching the drain voltage $V_D$ to either the $V_{Dop}$ level of supply terminal C (which defines the operational, current blocking level across the source and drain) or the $V_{Dstress}$ level of supply terminal D (which defines the conductive stress state in which hot-carrier induced charge trapping occurs).

A programmable temperature chuck (e.g., hot plate) 380 is further provided for heating the transistor under test 10' to a desired temperature. A temperature sensor 382 is further provided for measuring the temperature of the transistor under test 10' and verifying that it is at the desired temperature.

A test control computer 360 is preferably included in test fixture 300 for automatically controlling the programmable voltage supply 350, for automatically controlling the programmable hot plate 380, for automatically operating switches 320, 324 and 326, and for automatically collecting and recording the data from meters 322 and 323. Connection reversing switch 320 responds to a forward/reverse mode control signal 362 output by the test control computer 360. Switches 324 and 326 respond to a stress/measure mode control signal 366 output by the test control computer 360. Meter signals 364 and 366 respectively carry the readings of current meters 322 and 323 to the test control computer 360. While not shown, a similar connection is made between the test control computer 360 and the substrate current meter 325 for allowing automated reading of the substrate current. The programmable voltage supply 350 responds to voltage control signals 367 supplied by the test control computer 360 and adjusts the voltages, $V_{Goff}$, $V_{Gstress}$, $V_{Dop}$, $V_{Dstress}$ and $V_{SUB}$ at its respective output terminals A, B, C, D and E accordingly.

The programmable temperature chuck 380 (e.g., hot plate) responds to temperature control signals 381 supplied by the test control computer 360. Temperature measurement signals 383 return the measurements of temperature sensor 382 to the test control computer 360 to close the temperature control loop.

One of the important features of test fixture 300 is that it includes a real-time clock 363 for allowing the test control computer 360 to keep track of the accumulated time spent by the transistor-under-test 10' under a maximum or other stress state.

As further seen in FIG. 3, test fixture 300 includes a forward/reverse data collecting means 368 for supplying data to a log/log curve fitting means 369. The log/log curve fitting means 369 supplies its result data to a leakage prediction modelling means 370. The forward/reverse data collecting means 368, log/log curve fitting means 369 and leakage prediction modelling means 370 may be provided separate from or operatively incorporated into the test control computer 360. They are shown separately for purposes of emphasizing certain, soon-to-be described aspects of the invention. The functions of the forward/reverse data collecting means 368, log/log curve fitting means 369 and leakage prediction modelling means 370 will become apparent when the test procedure and results are described later below.

Another important feature of test fixture 300 is that its first through fourth terminal contacts 311–314 can be disconnected from a first transistor-under-test 10' and reconnected to a second transistor-under-test 10" either in a case where the second transistor-under-test 10" is located on the same substrate 5' as the first transistor-under-test 10' or in a case where the transistors under test are formed on different substrates. This allows the test fixture 300 to be used in characterizing transistors formed by a same fabrication process but having channel lengths of gradually decreasing size (e.g., $L_{M1} > L_{M2} > L_{M3} > \ldots$) or characterizing transistors formed by different fabrication processes (e.g., different P and N doping profiles) but having same channel lengths.

TEST PROCEDURE

Figure 4:
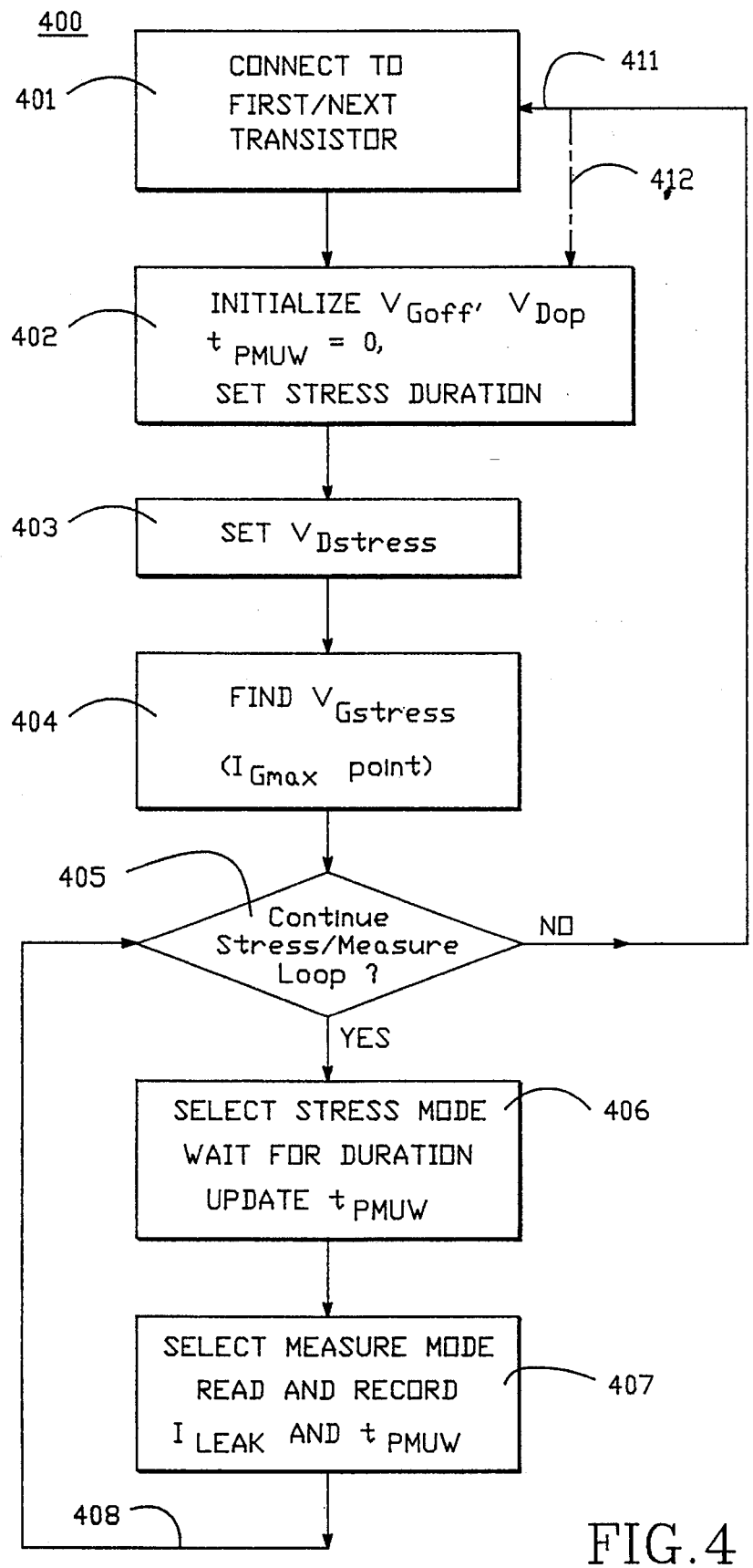
FIG. 4 is a flow chart of a test procedure in accordance with the invention.

A preferred procedure 400 for operating the test fixture 300 of FIG. 3 is diagrammed in FIG. 4. It is understood that test control computer 360 is programmed in accordance with well known programming practices to automatically carry out most, if not all, of the steps of procedure 400. (One or more of the steps may be performed manually if desired.)

At step 401, first through third terminal contacts 311–313 are connected to the respective source, drain and gate portions of a first transistor-under-test 10'. All output terminals A–E of programmable voltage supply 350 are at 0 V at this time. Switches 324 and 326 are in a leakage-measurement mode wherein their respective arms make respective connections to the C and A terminals of programmable voltage supply 350. Connection reversing switch 320 is in a forward mode wherein it connects source region 11' of the transistor-under-test 10' to the supply ground and wherein it connects drain region 12' of the transistor-under-test 10' to the arm of drain switch 324.

At step 402, the test control computer 360 sends voltage control signals 367 to the programmable voltage supply 350 for initializing the values of voltage levels $V_{Goff}$ and $V_{Dop}$ (supply terminals A and C). The temperature control loop 380–383 is activated to maintain a desired operating temperature such as 25° C. (room temperature).

$V_{Goff}$ is typically set to 0 V (ground) but it may be set to other subthreshold levels if desired. The dashed line connecting terminals A and GND indicate this typical connection.

$V_{SUB}$ is typically set to 0 V (ground) but it may be set to other levels if desired. The dashed line connecting terminals E and GND indicate this typical connection.

$V_{Dop}$ is typically set to a value representing a worst-case, drain-to-source blocking voltage that is expected to develop between the drain and source regions 12'–11' of a replica (not shown) of the transistor-under-test 10' when the replica of transistor 10' is placed in a target operating circuit (not shown) and $V_{Goff}$ is applied to the gate of the replica for the purpose of switching the replica into a nonconductive off-state. $V_{Dop}$ will typically have an absolute magnitude of 5.5 V when the target operating circuit has a nominal operating voltage of 5 V. $V_{Dop}$ will typically have an absolute magnitude of 3.6 V (10% above nominal) when the target operating circuit has a nominal operating voltage of 3.3 V. Of course, $V_{Dop}$ can be set to the nominal drain-to-source operating voltage of the replica in its target circuit instead of a worst-case drain-to-source blocking voltage.

The setting of $V_{Dop}$ will vary with the purpose of each test. It is important for purposes of meaningful measurement, however, that $V_{Dop}$ should not be allowed to reach an avalanche breakdown voltage or other destructive drain-to-source voltage of the transistor-under-test 10'. The leakage measurement steps should not cause any substantial, permanent damage to the physical structure of the transistor under test. Test results would be basically meaningless if a transistor that has been damaged by previous leakage measurements is used for further measurements. After all, the replica transistor (not shown) that is to be placed in the target circuit (not shown) is not normally brought into a damaging mode of operation. The operational voltage $V_{Dop}$ that is used for making leakage measurements in test fixture 300 should likewise be of a nondestructive nature.

Values for a worst-case post-manufacture utilization time variable, $t_{PMU(W)}$, and a stress cycle period (duration) are also initialized at step 402. The worst-case post-manufacture utilization time variable, $t_{PMU(W)}$, is initialized to zero and incremented by the stress duration amount in a below-described step 406 each time the test control computer 360 cycles about a stress-and-measure loop 408.

At step 403, the test control computer 360 sends further voltage control signals 367 to the programmable voltage supply 350 for setting the value of voltage level $V_{Dstress}$.

$V_{Dstress}$ often represents a drain-to-source forward voltage that is expected to develop in a replica (not shown) of transistor 10' between the drain and source regions 12'–11' of the replica when the replica transistor (10') is placed in a target operating circuit (not shown) and switched into the conductive on-state.

A drain-to-source voltage less than $V_{Dop}$ will usually develop across the replica transistor (not shown) when the replica transistor is switched on in the target circuit. If a realistic idea is desired of how leakage will evolve over time in the replica transistor while it is in the target circuit, $V_{Dstress}$ should be set to the nominal or worst-case (largest) drain-to-source voltage that is expected to develop across the replica in the target circuit while the replica is in the conductive state.

On the other hand, for purposes of accelerated testing, it may be useful to raise $V_{Dstress}$ above the worst-case stress level that the replica transistor (10') will see in the target circuit. In such a case, $V_{Dstress}$ will be typically set equal to or larger than $V_{Dop}$. $V_{Dstress}$ should not, however, be raised to or above an avalanche breakdown voltage ($V_{Dav}$) or other physically damaging level of transistor 10', if such operation is not representative of what will happen to the replica in the target circuit. Typical values for $V_{Dstress}$ are 5.5 V to 7 V for settings of $V_{Dop}$ between 5.0 V and 5.5 V. Typical values for $V_{Dstress}$ are 3.6 V 5.5 V for cases where $V_{Dop}$ is approximately 3.3 V.

A sacrificial transistor (not shown) of identical structure to the transistor 10' that is to be put under-test, may be provided on the same substrate 5' and used for determining the avalanche breakdown voltage ($V_{Dav}$). Once the avalanche breakdown point has been exceeded, the sacrificial transistor (not shown) is set aside and not used for further testing. A "fresh" copy of transistor 10', that has not been destructively stressed, is used to characterize the leakage over time properties of the transistor design 10' under study.

At step 404, switches 324 and 326 are switched into a "stress" mode to make respective connection with the D and B supply terminals of programmable voltage supply 350. Connection reversing switch 320 is held in the forward mode. The gate voltage $V_G$ at supply terminal B is incremented from the $V_{Goff}$ level to a $V_{Gstress}$ level at which gate current meter 323 detects a maximum flow of gate current $I_G$. The absolute value of $V_{Gstress}$ is constrained to not exceed that of $V_{Dstress}$. Gate leakage reading 365 is used to close the control loop for finding the $V_{Gstress}$ level that produces maximum gate current $I_G$.

The $V_{Gstress}$ finding step 404 should be conducted quickly so that it does not hold the transistor-under-test 10' in a stress condition for any significant length of time. If considerable time is required for finding the $V_{Gstress}$ level, a second sacrificial transistor (not shown) of identical structure to the transistor 10' that is to be put under-test, may be provided on substrate 5' and used for determining the $V_{Gstress}$ level. Once the $V_{Gstress}$ level has been found, the second sacrificial transistor (not shown) is set aside and not used for further testing. A "fresh" transistor of identical structure (and preferably on the same substrate so it is formed under identical process conditions) is connected to the test fixture 300 and used to characterize the leakage over time properties of the transistor design 10' under study.

Of course, it is possible to set $V_{Gstress}$ to values other than the maximum stress value. The value of $V_{Gstress}$ will vary depending on the purpose of the test. In some instances, where the gate leakage current $I_G$ is too small to be measured by meter 323, an indirect method may be used where the substrate leakage current $I_{SUB}$ is measured by meter 325 and a peak or other transition in the waveform of the measured substrate current is used as an indication of a maximum stress point.

Step 405 represents both an entry and exit point for a stress/measure loop 408. The loop 408 includes a transistor stressing step 406 and a leakage current measurement step 407.

At step 406, switches 324 and 326 are switched into the stress mode to make respective contact with the D and B supply terminals. Connection reversing switch 320 is placed into the forward mode. Real-time clock 363 is used to measure out a waiting period of the duration specified in step 402. During this waiting period, the transistor-under-test 10' is held in the so-called maximum stress state (or another kind of stress state if so desired), with its gate voltage $V_G$ at $V_{Gstress}$, and its drain voltage $V_D$ at $V_{Dstress}$. The variable representing accumulated post-manufacture utilization time $t_{PMU(W)}$ is updated to indicate the accumulated post-manufacture time for which transistor 10' has been in the maximum stress state. The worst-case accumulated utilization time $t_{PMU(W)}$ is referred to later below also as "stress time".

As soon as the maximum stress state waiting-period expires, procedure 400 shifts into the leakage current measurement step 407. In step 407, switches 324 and 326 are switched into the leakage-measurement mode to make respective contact with the C and A terminals of programmable voltage supply 350. Connection reversing switch 320 is first held in the forward mode and a reading 364 is taken of the leakage current $I_{LEAK}$, if any, that flows through the transistor-under-test 10' in the forward direction (from source region 11' to drain region 12') as a result of transistor 10' having been stressed for accumulated post-manufacture utilization time $t_{PMU(W)}$. The values of the accumulated post-manufacture utilization time $t_{PMU(W)}$ and corresponding forward leakage current $I_{LEAK}$ are sent to the forward/reverse data collecting means 368 (FIG. 3) and are recorded by means 368. The forward/reverse data collecting means 368 includes technology associated means (not shown) for associating the recorded data with data representing the fabrication technology of the transistor-under-test 10'. The data that represents the fabrication technology of the transistor-under-test 10' includes, but is not limited to: the channel length and width of the transistor; other geometric aspects of the transistor such as gate thickness and source/drain depths; the doping profiles used in manufacturing the transistor; and so forth.

Next, connection reversing switch 320 is switched into a reverse mode wherein it connects source region 11' of the transistor-under-test 10' to the arm of drain switch 324 and wherein it connects drain region 12' of the transistor-under-test 10' to the supply ground. A second reading 364 is taken of the leakage current $I_{LEAK}$, if any, that flows through the transistor-under-test 10' in the reverse direction (from drain region 12' to source region 11') as a result of transistor 10' having been stressed in the forward direction for accumulated post-manufacture utilization time $t_{PMU(W)}$. The values of the accumulated post-manufacture utilization time $t_{PMU(W)}$ and corresponding reverse leakage current $I_{LEAK}$ are sent to the forward/reverse data collecting means 368 (FIG. 3) and are recorded by means 368.

Loop 408 is repeated a sufficient number of times and for a sufficiently long period of time to enable the forward/reverse data collecting means 368 to collect enough data so that the downstream curve fitting means 369 can fit modelling curves of desired degree and accuracy to the collected data. The optimal number of times for repeating the stress/measure loop 408 and the optimal wait for transistor stressing step 406 are determined empirically as experience with a particular class of transistors is obtained. This will be appreciated by those skilled in the art once some sample test results are discussed below.

When a decision is made at the loop branch point 405 that loop 408 has been repeated enough times, control returns to step 401 as indicated by process flow line 411. At step 401, the first through third terminal contacts 311–313 are disconnected from the first transistor-under-test 10' and connected to a next transistor 10" to-be-placed under-test. As mentioned earlier, the next transistor-under-test 10" can be located on the same substrate 5' as the first transistor-under-test 10' to permit comparison of transistors formed by a same fabrication process but having different lithographically determined dimensions such as channel lengths of gradually decreasing size (e.g., $L_{M1}>L_{M2}>L_{M3}> \ldots$). Alternatively or additionally, some of the next transistors $10^{x(.)}$ to-be-placed under-test at step 401 can be situated on different substrates so that a comparison can be made of the leakage characteristics of transistors formed by different fabrication processes (e.g., different P and N doping profiles) but having same lithographically determined dimensions such as same channel lengths.

As an alternative to testing a fresh transistor according to process flow line 411, an already-stressed transistor may be subjected to a new stress and/or leakage measurement environment as indicated by process flow line 412. If process flow line 412 is followed, the step of resetting the accumulated post-manufacture utilization time $t_{PMU(W)}$ variable to zero in step 402 should be bypassed.

For statistical and/or accuracy reasons, it may be advisable to test a plurality of identical transistors on the same substrate either simultaneously or sequentially and to process the data so that, statistically speaking, it represents the results of an "average" or "mean" transistor.

SAMPLE TEST RESULTS

Figure 5A:
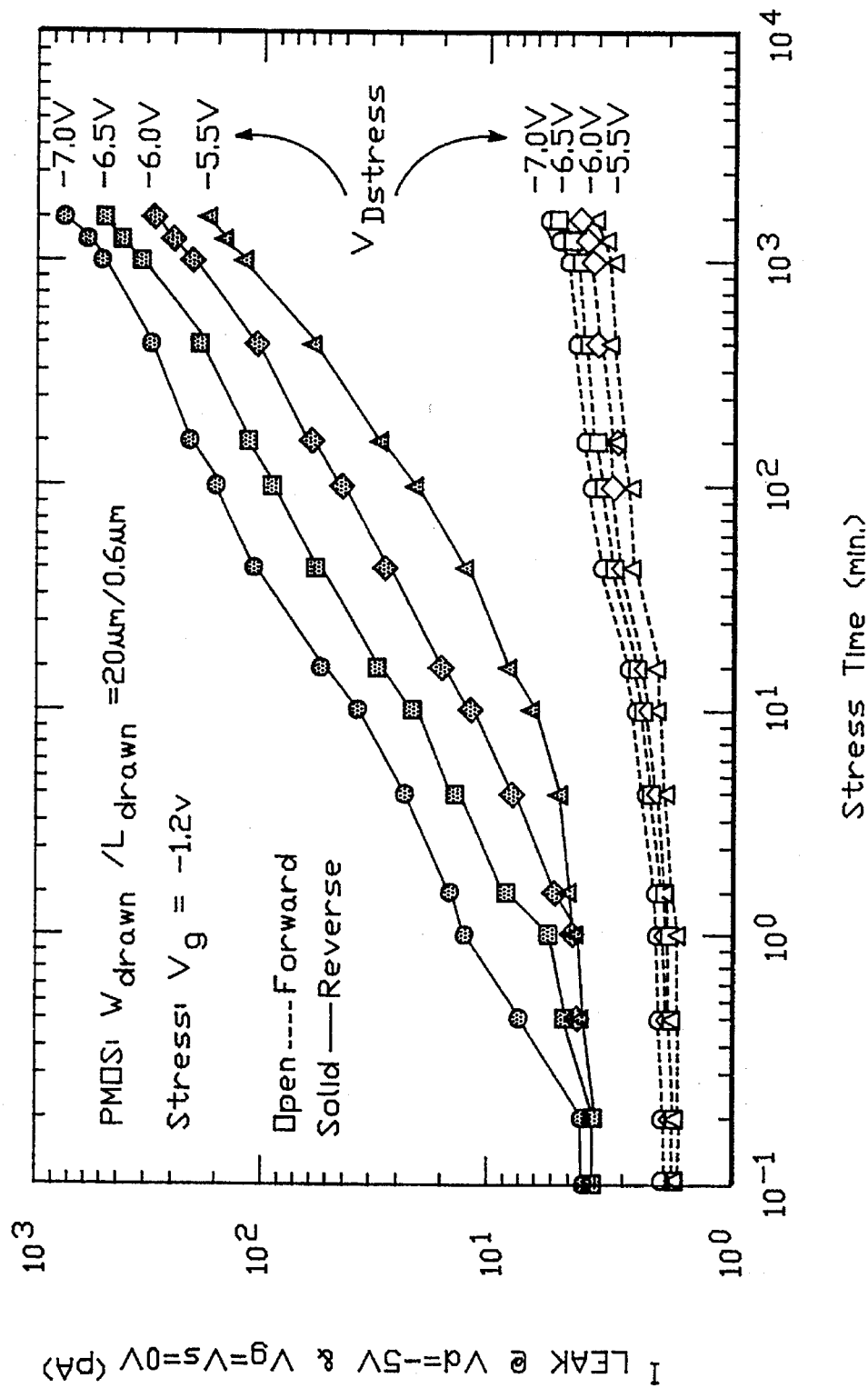
FIG. 5A shows plots obtained with the test fixture of FIG. 3 for leakage current of buried channel devices versus accumulated post-manufacture stress time, given different values of drain-to-source stress voltages on a log/log graph.

FIG. 5A plots on a logarithm by logarithm graph (log/log graph) the data for leakage current versus accumulated stress time as measured by the fixture 300 of FIG. 3. A buried channel PMOS transistor was used with respective drawn width and drawn length dimensions, 20 microns and 0.6 microns. The leakage measurement step (407, FIG. 4) was carried out at $V_{Dop}=-5$ V, $V_{Goff}=0$ V and $V_{SUB}=0$ V. The transistor stressing step (406, FIG. 4) was carried out on fresh samples of the PMOS transistor using $V_{Gstress}=-1.2$ V and respective values of $V_{Dstress}=-5.5$ V, $-6.0$ V, $-6.5$ V and $-7.0$ V for each of the respective fresh samples of the subject PMOS design.

The vertical coordinate of FIG. 5A shows $I_{LEAK}$ in terms of picoamperes (pA) over the logarithmic range $10^0$ to $10^3$. The horizontal coordinate of FIG. 5A shows accumulated stress time in terms of minutes over the logarithmic range $10^{-1}$ to $10^4$. The forward leakage measurements are represented by respective, unshaded triangles, diamonds, squares and circles for the values of $V_{Dstress}=-5.5$ V, $-6.0$ V, $-6.5$ V and $-7.0$ V. The results of the reverse leakage measurement tests are shown by corresponding, solidly-shaded triangles, diamonds, squares and circles.

As seen in FIG. 5A, leakage current in the reverse measurement mode is significantly higher than in the forward measurement mode. The variation of $V_{Dstress}$ had a small effect on $I_{LEAK}$ in the forward measurement mode and a somewhat greater effect in the reverse measurement mode.

Figure 5B:
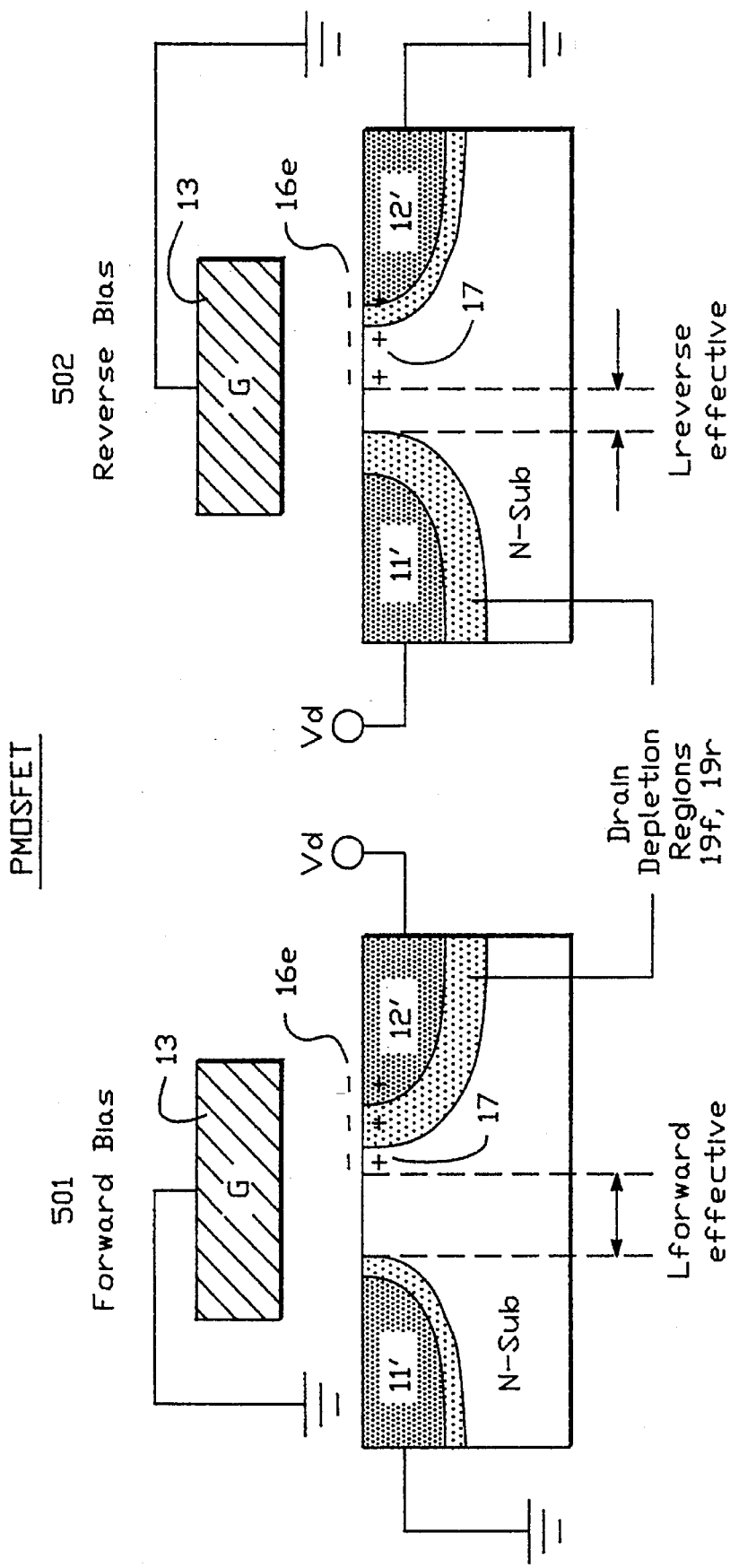
FIG. 5B diagrams a mechanism which is believed responsible for the difference between forward and reverse leakage results observed in FIG. 5A.

FIG. 5B diagrams a mechanism which is believed responsible for the observed difference between forward and reverse leakage measurements. The equivalent circuit for the forward leakage measurement test is shown under 501 while the equivalent circuit for the reverse leakage measurement test is shown under 502. Trapped electrons 16e collect near region 12' during the forward-driven stress mode (406, FIG. 4). In the forward leakage test 501, region 12' serves as what is traditionally called the drain while region 11' serves as the source. A reverse-bias depletion region 19f forms about region 12' as a result of the turn-off gate voltage $V_G=0$ V. This depletion region 19f overlaps with the positive charges 17 attracted to the silicon/oxide interface by trapped electrons 16e. The effective channel length resulting from the overlap of depletion region 19f and attracted positive charges 17 is represented as $L_{forward\text{-}effective}$.

In the reverse leakage measurement test 502, region 11' serves as what is referred to conventionally as the drain while region 12' serves as the source. Drain depletion region 19r forms about region 11' while the trapped electrons 16e that were formed by hot-carrier injection continue to congregate about region 12'. As a result, the effective channel length, $L_{reverse\text{-}effective}$, is defined by the sum of the shortening effects separately provided by depletion region 19r and attracted positive charges 17. $L_{reverse\text{-}effective}$ therefore tends to be shorter than $L_{forward\text{-}effective}$. This mechanism is believed responsible for the higher leakage currents seen in the reverse leakage measurements as compared to the forward leakage measurements.

Figure 6:
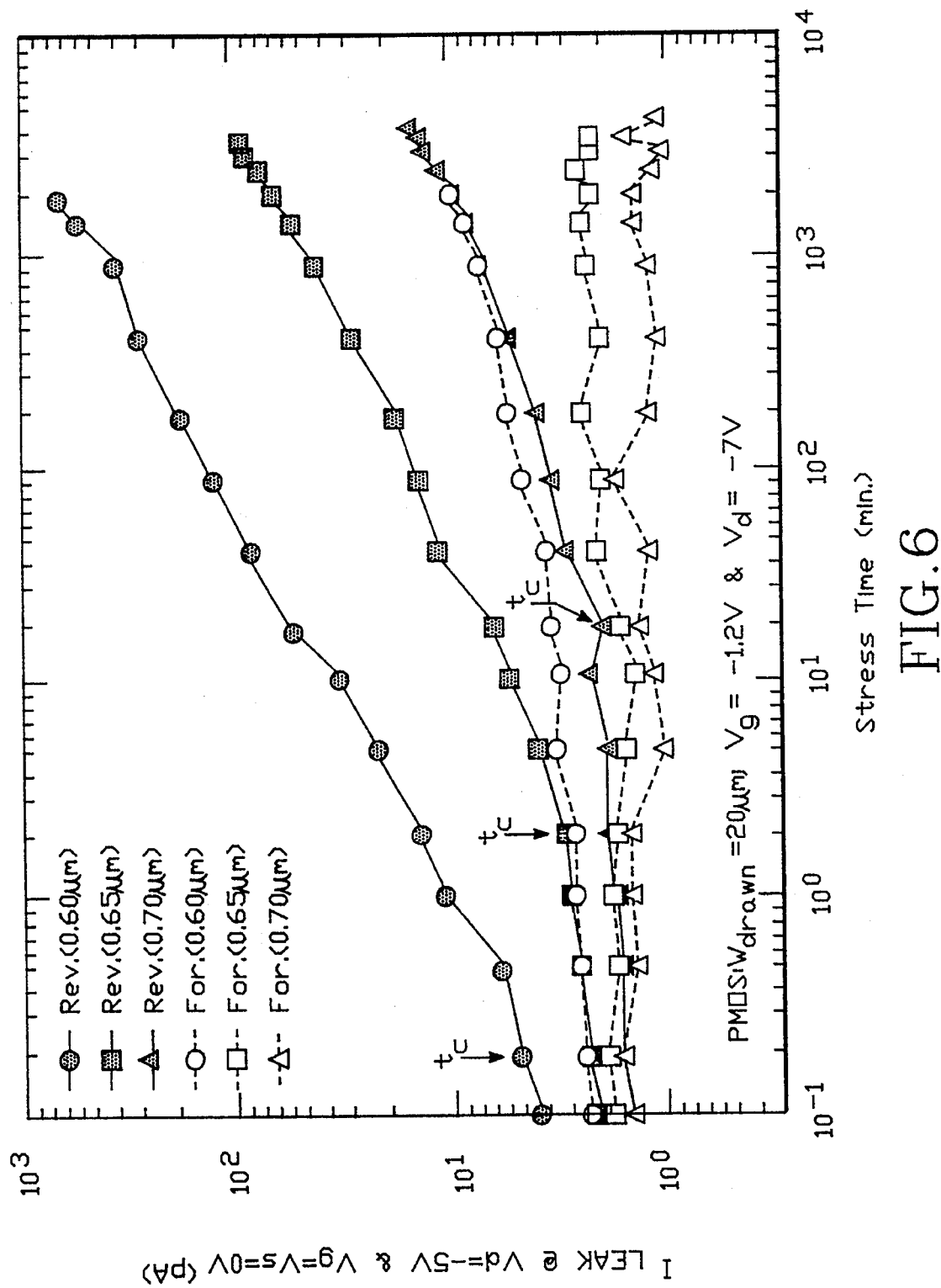
FIG. 6 shows plots obtained with the test fixture of FIG. 3 for leakage current of buried channel devices versus accumulated post-manufacture stress time for different values of channel length on a log/log graph.

FIG. 6 shows plots of leakage current versus stress time for different values of channel length on a log/log graph. The transistors under test were buried channel PMOS devices each having a drawn width of 20 microns. Circle, square, and triangle symbols are respectively used to represent the results for corresponding drawn channel lengths of 0.60 microns, 0.65 microns and 0.70 microns. Unshaded circle, square and triangle symbols represent the forward leakage results. Shaded circle, square and triangle symbols represent the reverse leakage measurement results. The stress condition for all tested transistors was $V_{Gstress}=-1.2$ V and $V_{Dstress}=-7$ V. The leakage measurement condition was $V_{Goff}=0$ V and $V_{Dop}=-5$ V.

Again it is seen that reverse leakage is greater than the corresponding forward leakage. More importantly, it is seen that a change of channel length can alter reverse current leakage by almost a full order of magnitude as one examines the results at accumulated stress times beyond 1,000 minutes. After 2,000 minutes of stress, the leakage current for the 0.60 micron samples was approaching 1,000 pA while the leakage current for the 0.65 micron samples was approximately 60 pA. And the comparative leakage current for the 0.70 micron samples was at a much lower 10 pA. Thus, it is seen that a change of just 0.05 microns in channel length has a significant effect on the long term, reverse leakage characteristics of a submicron transistor.

Channel length also has a significant affect on the forward leakage of a transistor. Note that the forward results for the 0.60 micron samples (open circles) is on the same order of magnitude as the reverse leakage results for the 0.70 micron samples (solid triangles).

Another important feature of the results shown in FIG. 6 is that the reverse leakage curves appear to have a two-slope shape. A shallow first slope is seen as accumulated stress time begins, and then, at some critical stress time $t_c$, a steeper second slope begins to take hold. This effect is best seen in FIG. 6 for the reverse 0.65 micron results (solid squares) and the 0.70 micron reverse leakage results (solid triangles).

Figure 7:
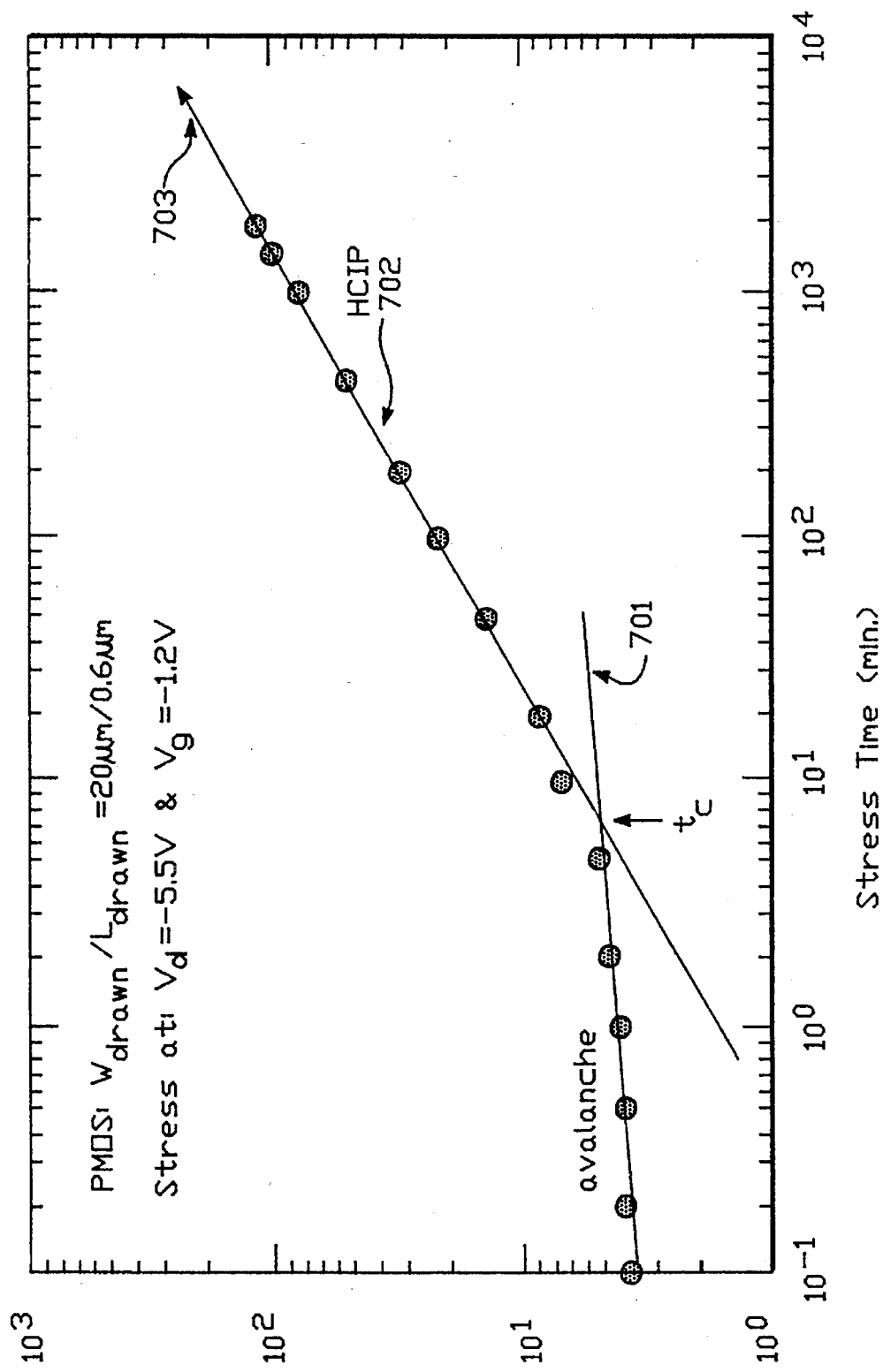
FIG. 7 shows a plot of reverse leakage current through a buried channel device versus accumulated post-manufacture stress time for a given stress condition and linear approximations on a log/log graph.

FIG. 7 shows one particular set of results which conform very closely with the two-slope model. The transistor under test was again a PMOS device having $W_{drawn}/L_{drawn}=20$ μm/0.6 μm. The stress state for this transistor was $V_{Bstress}=-5.5$ V and $V_{Gstress}=-1.2$ V. Only the reverse leakage results are shown for the leakage measurement condition: $V_{Dop}=-5$ V and $V_{Goff}=0$ V.

As seen in FIG. 7, the critical time point $t_c$ occurs at approximately eight minutes. Before $t_c$, the reverse leakage results conform with a first straight line 701 of relatively shallow slope when plotted on a log/log graph. After critical time point $t_c$, the results conform with a second straight line 702 having a much larger slope. Critical stress time $t_c$ is defined by the intersection of lines 701 and 702.

The steeper line 702 is believed to represent reverse leakage current which is dominated by Hot-Carrier Induced Leakage (HCIL). The reverse leakage results of the shallower first line 701 are believed to be dominated by an avalanche breakdown and/or other intrinsic mechanisms that are seen in fresh devices when tested immediately after manufacture.

The strong linearity of the results shown in FIG. 7 following critical time point $t_c$ supports the proposition that leakage current due to Hot-Carrier Induced Leakage (HCIL) can be predicted for stress times exceeding the measurement time (e.g. exceeding $10^4$ minutes, which is approximately 167 hours or 7 days) by extending straight line 702 further along the log/log plot as indicated by arrowhead 703.

DEVELOPMENT OF PREDICTION MODEL

The two-slope characteristic of the leakage measurement results shown in FIG. 7 supports the simple two-mechanism model given by below equation Eq. 1:

$$I_{LEAK} = I_{INT} + I_{HCIL} \quad \text{(Eq. 1)}$$

where $I_{INT}$ represents intrinsic leakage present in a fresh (unused) device before the onset of hot-carrier induced leakage and, by definition, $I_{HCIL}$ equals zero when the accumulated utilization time is zero.

If the leakage contribution $I_{INT}$ due to avalanche or other intrinsic mechanisms (701) is removed, one can approximate the hot-carrier-induced leakage contribution as given by the following approximating equation, Eq. 2:

$$\log(I_{HCIL}) = A \cdot \log(t_{PMU} - t_c) + \log(B) \ldots \text{ for } t_{PMU} > t_c \quad \text{(Eq. 2)}$$

where A is the slope of the steep line (702) on the log/log graph grid and B is an intersection constant. Taking the anti-logarithm of both sides of Eq. 2, one can formulate the following approximating equations, Eq. 3a and 3b.

$$I_{HCIL} = B \cdot (t_{PMU} - t_c)^A \text{ for } t_{PMU} > t_c \quad \text{(Eq. 3a)}$$

$$I_{HCIL} = 0 \text{ for } t_{PMU} \leq t_c \quad \text{(Eq. 3b)}$$

Figure 8:
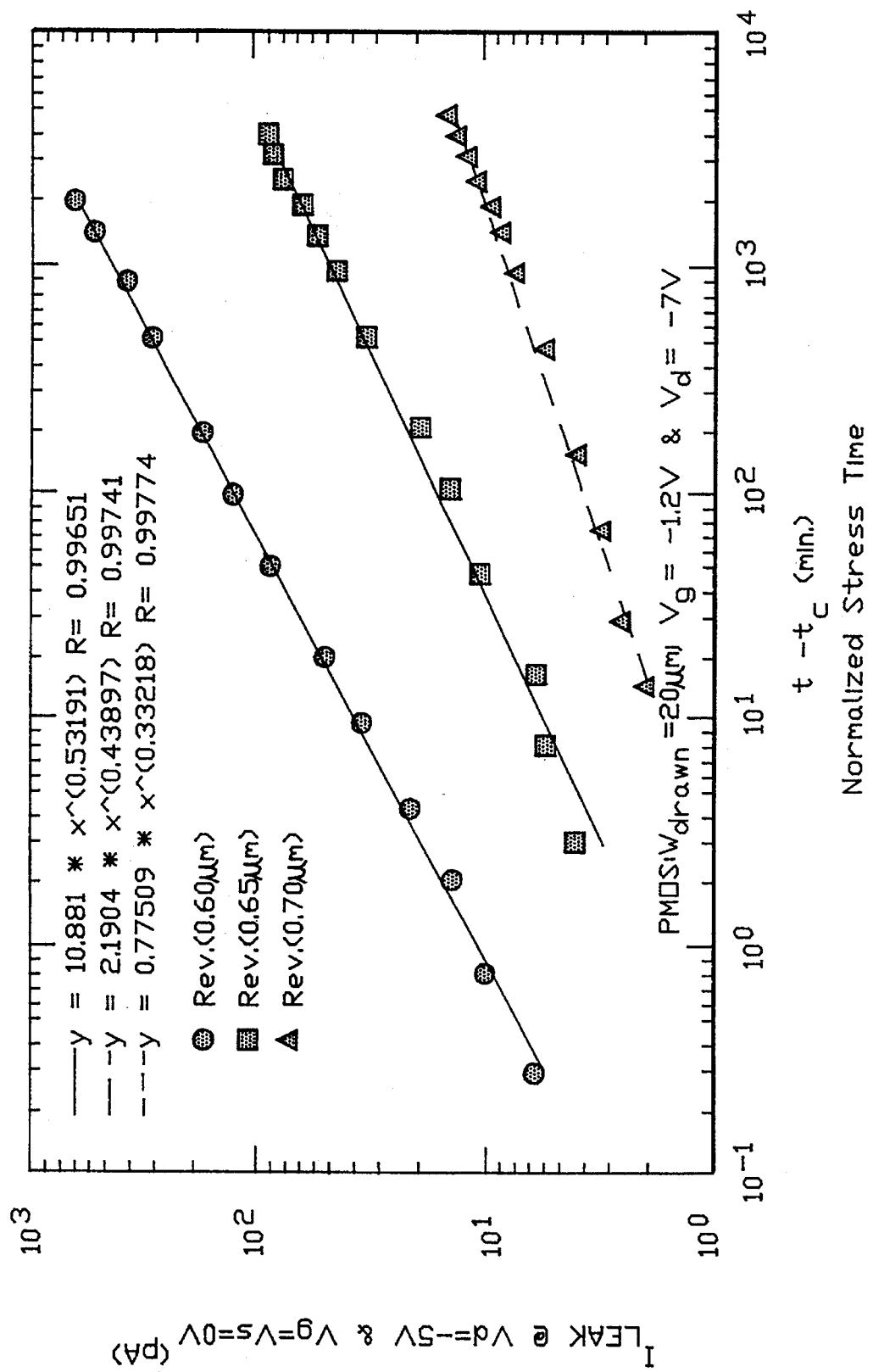
FIG. 8 shows plots fitted to test results of leakage current versus normalized post-critical stress time for different values of channel length on a log/log graph.

FIG. 8 shows on a log/log graph that the slope factor "A" changes as a function of channel length, increasing significantly as channel length is reduced. The results shown are for reverse leakage measurements on buried channel PMOS transistors ($W_{drawn}=20$ μm) with $V_{Dstress}=-7$ V, $V_{Gstress}=-1.2$ V, $V_{Dop}=-5$ V and $V_{Goff}=0$ V. Solid circles, squares and triangles respectively denote measurements for drawn channel lengths of 0.60 μm, 0.65 μm and 0.70 μm. Stress time is normalized into terms of post-manufacture utilization time $t_{PMU}$ minus critical stress time $t_c$. Avalanche-dominated and/or other intrinsic leakage is ignored.

A first set of curve fitting operations is used to find the least-square linear fit on the log/log graph for the results produced by measurements respectively on the 0.60 μm, 0.65 μm and 0.70 μm test samples. Three corresponding, linear prediction equations, Eq. 4a to Eq. 4c, are then obtained as set forth below.

$$\log (I_{HCIL}) = 0.53191 \log (t-tc) + \log (10.881) \ldots \text{ for } L=0.60 \quad \text{(Eq. 4a)}$$

$$\log (I_{HCIL}) = 0.43897 \log (t-tc) + \log (2.1904) \ldots \text{ for } L=0.65 \quad \text{(Eq. 4b)}$$

$$\log (I_{HCIL}) = 0.33218 \log (t-tc) + \log (0.77509) \ldots \text{ for } L=0.70 \quad \text{(Eq. 4c)}$$

The software used for generating the least-square linear fits reported respective residue values of R=0.99651, 0.99741 and 0.99774, which is quite good. The specific curve fitting software used is not important. Any commercial-grade, curve-fitting package may be used. Examples include but are not limited to: ORIGIN™ available from MicroCal Software Inc. of Northampton, Mass.; CricketGraph™ available from Computer Associates; KaleidaGraph™ available from Apple Computer Inc. of California; and Excel™ available from MicroSoft of Washington.

A second set of curve fitting operations is thereafter used to find the least-square linear fit on a log/linear graph for index parameter A versus channel length L using the first curve-fit results shown by the above three equations, Eq. 4a through Eq. 4c. A third set of curve fitting operations is used to find the least-square linear fit on a log/linear graph for intersection parameter B versus channel length L using the first curve-fit results shown by the above three equations, Eq. 4a through Eq. 4c.

Recall that parameters A and B are used in the general linear fit model:

$$\log (I_{HCIL}) = A \cdot \log (t_{PMU} - t_c) + \log (B) \ldots \text{ for } t_{PMU} > t_c \quad \text{(Eq. 2)}$$

Let A satisfy the linear relation with L of:

$$A = M - N \cdot L \quad \text{(Eq. 5a)}$$

Let B satisfy the linear relation with L of:

$$\log (B) = J - K \cdot L \quad \text{(Eq. 5b)}$$

Then one can obtain a modified model for $I_{HCIL}$ as given by the following equations, Eq. 5c and Eq. 5d:

$$I_{HCIL} = J' e^{[-K \cdot L]} (t_{PMU} - t_c)^{[M-N \cdot L]} \ldots \text{ for } t_{PMU} > t_c \quad \text{(Eq. 5c)}$$

$$I_{HCIL} = 0 \text{ for } t_{PMU} \leq t_c \quad \text{(Eq. 5d)}$$

where $I_{HCIL}$ is given in terms of picoamperes (pA), L represents drawn channel length in terms of microns (μm), e represents the natural base, $t_{PMU}$ and $t_c$ are given in terms of minutes, and J', K', M and N are empirically derived characterization constants. (Note that the primed constants, J' and K', are used for the natural base, e. Other constants would be used if the representation of intersection parameter B were in terms of base 10 or another base.) When curve fitting was applied to the buried-channel PMOS transistors tested for FIG. 8, the following empirical results were obtained:

$$J' = 7.58 \times 10^7 \quad \text{(Eq. 6a)}$$

$$K' = 26.42 \quad \text{(Eq. 6b)}$$

$$M = 1.73 \quad \text{(Eq. 6c)}$$

$$N = 2.00 \quad \text{(Eq. 6d)}$$

And Eq. 5c was accordingly rewritten as the below Eq. 6e:

$$I_{HCIL} = 7.58 \times 10^7 e^{-26.42 L} (t_{PMU} - t_c)^{[1.73 - 2 \cdot L]} \ldots \text{ for } t_{PMU} > t_c \quad \text{(Eq. 6e)}$$

It is to be understood that above equation, Eq. 6e is applicable to transistors made with a 0.7 micron, triple metal, high performance CMOS fabrication process equivalent or similar to that used for the sample transistors whose test results are shown in FIG. 8. A different prediction model would have to be developed in accordance with the above-described steps for insulated gate devices formed with a substantially different technology.

Critical stress time $t_c$ varies as a function of channel length, as seen in FIGS. 5A and 6. What may not be so clear is that critical stress time $t_c$ also varies as a function of $V_{Dstress}$. The results of FIGS. 5A and 6 were used to develop a general model for determining critical stress time $t_c$ as given by below equation Eq. 7:

$$t_c = Q e^{-[R \cdot L - S \cdot V_{Dstress}]} \quad \text{(Eq. 7)}$$

where $t_c$ is given in terms of minutes, drawn channel length L is given in terms of microns, stress voltage $V_{Dstress}$ is in terms of volts, and Q, R and S are empirically derived constants. Critical stress time $t_c$ was plotted on a linear/log graph, first as a function of variations only in L and second as a function of variations only in $V_{Dstress}$. When curve fitting was applied to the buried-channel PMOS transistors tested for FIG. 8, the following empirical results were obtained:

$$Q = 8.80 \times 10^{-7} \quad \text{(Eq. 8a)}$$

$$R = 46.05 \quad \text{(Eq. 8b)}$$

$$S = 2.19 \quad \text{(Eq. 8c)}$$

And Eq. 7 was accordingly rewritten as the below Eq. 8d:

$$t_c = 8.80 \times 10^{-7} e^{-[46.05 L - 2.19 V_{Dstress}]} \quad \text{(Eq. 8d)}$$

As with Eq. 6e, it is to be understood that above equation, Eq. 8d is applicable to transistors made with a 0.7 micron, triple metal, high performance CMOS fabrication process equivalent or similar to that used for the sample transistors whose test results are shown in FIGS. 5A and 6. A different prediction model would have to be developed in accordance with the above-described steps for insulated gate devices formed with a substantially different technology.

Given the above example of how test-result data is collected, correlated, curve-fitted and extended to define a prediction model for predicting the hot-carrier-induced leakage (HCIL) over post-manufacture utilization time ($t_{PMU}$) of an insulated gate field effect device; the structures for the forward/reverse data collecting means 368 of FIG. 3, the curve fitting means 369 of FIG. 3 and the leakage prediction modelling means 370 of FIG. 3 should apparent to those skilled in the art.

In brief, the forward/reverse data collecting means 368 organizes result data relative to post-manufacture utilization time ($t_{PMU}$) according to forward or reverse stress orientation. The forward/reverse data collecting means 368 is operated such that it collects sufficient data to define for at least two, and more preferably at least three settings of manufactured channel length $L_M$ or another variable (e.g., $V_{Dstress}$), a multi-slope plot of $I_{LEAK}$ versus accumulated post-manufacture utilization time ($t_{PMU}$).

The log/log curve fitting means 369 produces least-square linear fits on the log/log curve of $I_{LEAK}$ versus $t_{PMU}$ for each case of manufactured channel length $L_M$ or another variable (e.g., $V_{Dstress}$).

The leakage prediction modelling means 370 produces a prediction model by extrapolating the results of the forward/reverse data collecting means 368 over different values of manufactured channel length $L_M$ or another variable (e.g., $V_{Dstress}$, channel doping, oxide thickness, etc.).

APPLICATION OF PREDICTION MODEL

Equations Eq. 6e and Eq. 8d can be used as a prediction model for predicting results over long periods of time (e.g., more than a month or year) without actually carrying out the corresponding experiments on the modelled class of transistors (buried channel PMOS) for the long periods of time.

As such one can see what effect choice of $V_{Dstress}$ has on the time it takes for hot-carrier-induced leakage (HCIL) to come into effect. The onset is predicted by the prediction equation for $t_c$. The below Table-1 predicts $t_c$ in minutes as a function of $V_{Dstress}$ for a buried channel PMOS transistor having a drawn channel length of 0.70 μm.

TABLE 1

| $V_{Dstress}$ | −7.0V | −6.5V | −6.0V | −5.5V | −5.0V |
|---|---|---|---|---|---|
| $t_c$ (min.) | 20 | 59 | 176 | 525 | 1568 |

Table-1 shows that the onset of hot-carrier-induced leakage (HCIL) can be delayed by reducing the stress voltage $V_{Dstress}$ to which the transistor is subject while in the conductive on-state.

One can use equations Eq. 6e and Eq. 8d to see how many years are required to reach different magnitudes of hot-carrier-induced leakage current per transistor for a given stress voltage $V_{Dstress}$ as shown in below Table-2. Table-2 assumes a drawn channel length of 0.70 μm.

TABLE 2

| $I_{HCIL}$ pA per each micron of channel width | 1 pA/μm | 10 pA/μm | 100 pA/μm |
|---|---|---|---|
| $V_{Dstress}$ = −7V | 0.044 yr. | 45 yrs. | 45672 yrs |
| $V_{Dstress}$ = −5V | 0.044 yr. | 45 yrs. | 45672 yrs |

As seen in Table-2, operational lifetimes for devices can vary by orders of magnitude depending on what level of leakage current can be tolerated within the lifetime of a device. A change of stress voltage $V_{Dstress}$ has little effect over the long term.

On the other hand, choice of channel length can have a dramatic effect on the expected time for reaching a maximum allowed level of leakage current. Assume that the normalized leakage allowed per transistor is 100 pA per each micron of channel width. Then, the below Table-3 shows in accordance with equations Eq. 6e and Eq. 8d how small changes in drawn channel length can alter the expected lifetime for $I_{HCIL(max)}$=100 pA/μm.

TABLE 3

| $L_{drawn}$ | 0.70 μm | 0.65 μm | 0.60 μm |
|---|---|---|---|
| $V_{Dstress}$ = −7V | 45672 yrs | 8.592 yr | 0.0405 yr |
| $V_{Dstress}$ = −5V | 45672 yrs | 8.595 yr | 0.0435 yr |

A decrease of drawn channel length from 0.70 μm to 0.65 μm reduces the expected time to reach $I_{HCIL(max)}$=100 pA/μm from 45,672 years to less than 9 years. And the next 0.05 μm length reduction from 0.65 μm to 0.60 μm reduces the expected time to reach $I_{HCIL(max)}$=100 pA/μm from the 9 year range to substantially less than one year.

DEEP SUBMICRON CHARACTERISTICS

Figure 9:
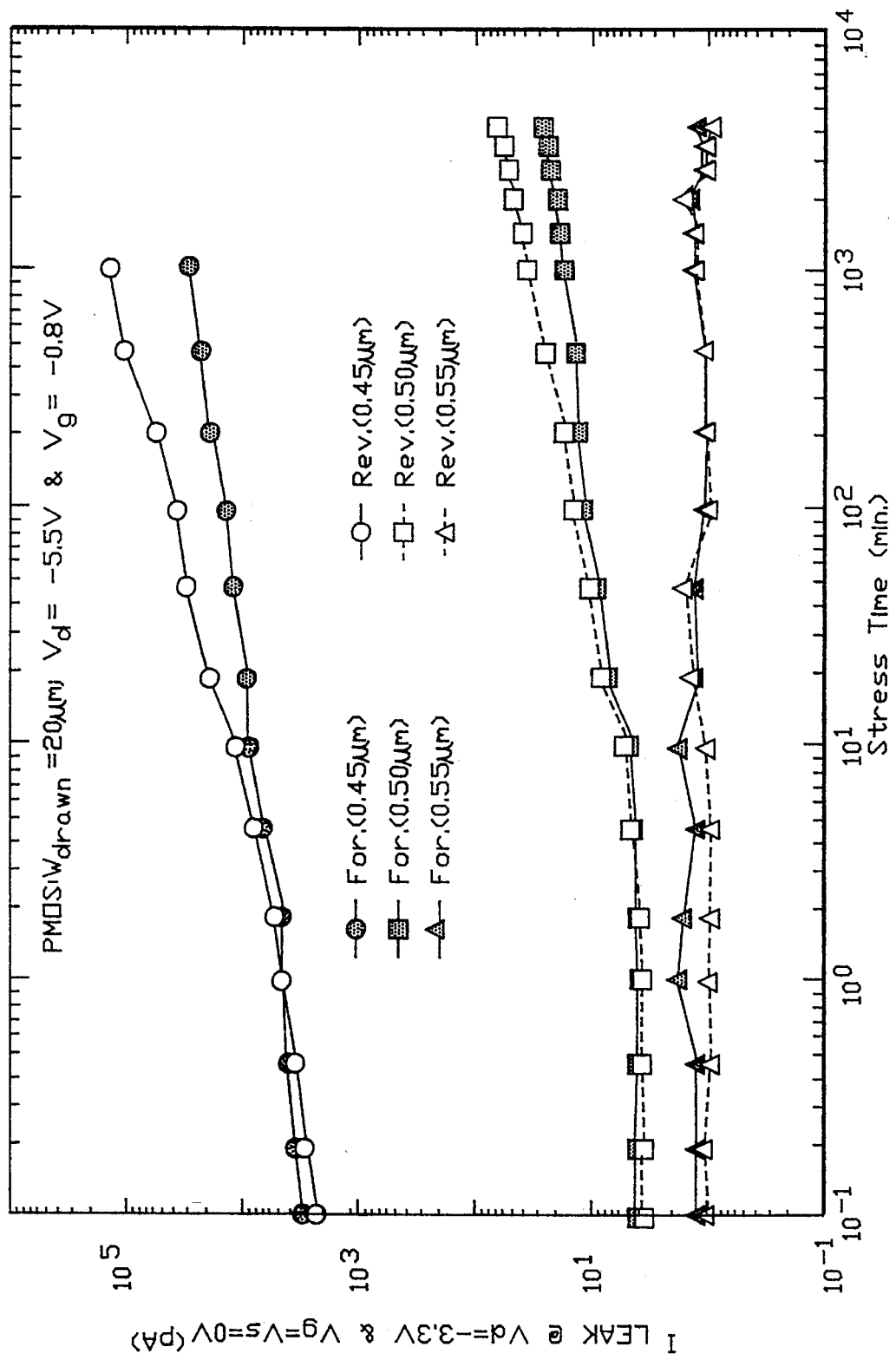
FIG. 9 shows plots obtained with the test fixture of FIG. 3 for leakage current through surface channel devices versus accumulated post-manufacture stress time for submicron and deep-submicron values of channel length on a log/log graph.
Figure 10:
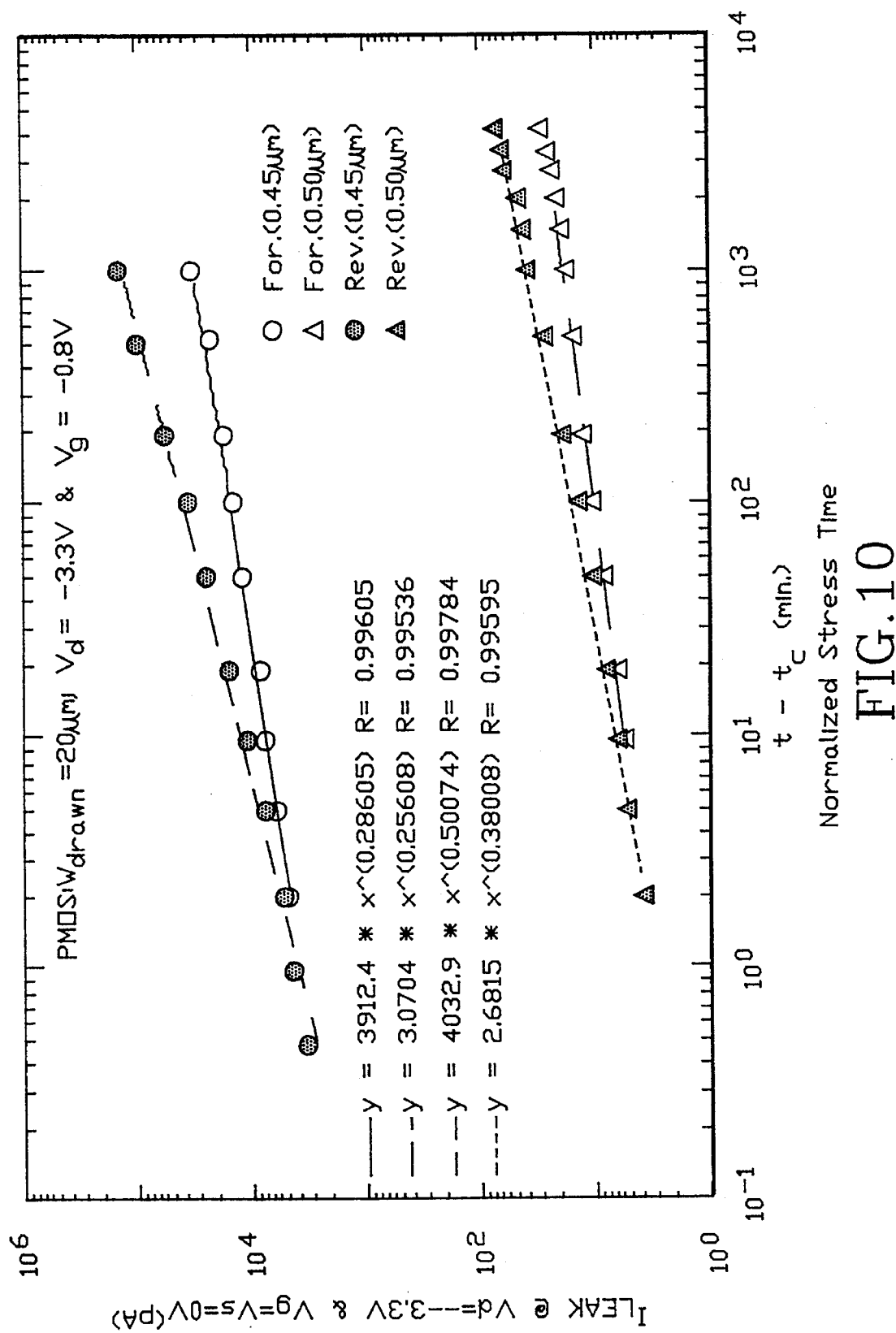
FIG. 10 shows plots fitted to test results of leakage current versus normalized post-critical stress time for surface channel devices having submicron and deep-submicron values of channel length, on a log/log graph.

Hot-carrier-induced leakage (HCIL) occurs in deep-submicron devices ($L_M$<0.5 μm) even to a greater extent than in larger submicron devices (0.5 μm≦$L_M$<1.0 μm). Additional intrinsic leakage mechanisms come into play when channel lengths enter the deep-submicron realm as indicated by FIGS. 9 and 10. The basic leakage formula can nonetheless continue to be expressed as:

$$I_{LEAK}=I_{INT}+I_{HCIL} \tag{Eq. 1}$$

where $I_{INT}$ represents intrinsic leakage present in a fresh (unused) device before the onset of hot-carrier induced leakage and, by definition, $I_{HCIL}$ equals zero when the accumulated utilization time is zero. A relatively larger intrinsic leakage, $I_{INT}$ is seen in the deep submicron devices as compared to the high-end submicron (0.5 μm≦$L_M$<1.0 μm) devices because the reduced channel length of the deep-submicron designs ($L_M$<0.5 μm) leads to drain-induced barrier lowering (DIBL) which in turn results in a substantial lowering of the device threshold voltage.

Deep-submicron designs ($L_M$<0.5 μm) tend to differ from high-end submicron designs (0.5 μm≦$L_M$<1.0 μm) in other respects. The high-end submicron designs can be manufacture with conventional I-line photolithography while the deep-submicron designs typically call for more exotic approaches such as phase-shift photolithography, or use of deep-ultraviolet or even X-ray wavelengths.

Device physics dictate the use of surface channel structures as opposed to a buried channel structures for the deep-submicron designs. A surface channel PMOS transistor (not shown) has a P-doped gate layer (13) as well as P-doped source and drain regions. The channel region develops at the silicon/oxide interface 15"/14". The oxide thickness $T_{ox}$ is oftentimes reduced. Lower operating voltages of $V_{Dop}$=−3.3 V are proposed to reduce power consumption and thereby take advantage of the smaller size. As such, the values for stress and leakage measurements change as designs scale down to shorter channel lengths. Below Table-4 shows a comparison of a submicron device against a deep submicron device.

TABLE 4

| Device | $L_M$ | $V_{Dop}$ | T oxide | $\Delta V_{th}$ | Xj | l |
|---|---|---|---|---|---|---|
| Sub-micron | 0.6 μm | −5.0V | 150Å | 25 mV | .25 μm | .10 μm |
| Deep sub-micron | 0.4 μm | −3.3V | 100Å | 2 mV | .18 μm | .04 μm |

$L_M$ represents the manufactured channel length. $\Delta V_{th}$ represents the amount of threshold lowering due to DIBL. Xj represents source and/or drain junction depth. "l" represents a characteristic length parameter that is equivalent to the classic pinchoff length, as will be understood by those skilled in the art.

In the deep-submicron designs ($L_M$<0.5 μm), leakage due to intrinsic mechanisms other than hot-carrier-induced leakage (HCIL) appear more pronounced at first. Nonetheless, hot-carrier-induced leakage $I_{HCIL}$ is expected to become the dominant leakage mechanism if one waits long enough for trapped charge particles 16e (FIG. 1C) to accumulate in large numbers within the gate insulating layer (14).

FIG. 9 shows the results of confirming experiments on surface channel PMOS transistors having manufactured channel lengths in the submicron and deep submicron realm. Fixture 300 (FIG. 3) was used as before measure forward and reverse leakage current $I_{LEAK}$. Solid circles, squares, triangles respectively represent leakage current results for forward measurements on devices having manufactured channel lengths of 0.45 μm, 0.50 μm and 0.55 μm. In similar fashion, unshaded circles, squares and triangles represent the corresponding reverse leakage measurements. The forward stress condition was $V_{Dstress}$=−5.5 V and $V_{Gstress}$=−0.8 V. The leakage measurement condition was $V_{Dop}$=−3.3 V and $V_{Goff}$=0 V.

The first thing to be noted in FIG. 9 is that leakage current $I_{LEAK}$ is two orders of magnitude higher for the 0.45 μm device as compared to the 0.60 μm device of FIG. 6. FIG. 9 shows a significant increase in leakage current as one moves from a channel length of 0.50 μm (squares) to 0.45 μm (circles). One of the reasons for this is that channel doping was not scaled as channel length was reduced. The same channel doping was used in the 0.45 μm device as was used in the 0.50 μm device. The same oxide thickness was also used. Those skilled in the art will appreciate that increased channel doping can be used to counter some of the intrinsic leakage seen in devices of shorter channel length.

Reverse hot-carrier induced leakage is still greater than forward leakage in FIG. 9, but the difference is not as significant as that seen in FIG. 6. Accordingly, unlike the case for high-end submicron (0.5 μm≦$L_M$<1.0 μm) designs, forward leakage should be considered to be of generally equal significance as reverse leakage in deep submicron designs.

The two-slope model continues to appear valid for the results of the 0.45 μm (circles) and 0.50 μm (squares) experiments. It is believed that the experimental data for the 0.55 μm device (triangles) did not exhibit the steeper, second slope because the critical stress time $t_c$ was beyond the maximum wait time of the experiment.

Referring to FIG. 10, the experiment results for the 0.45 μm and 0.50 μm devices were used to formulate a model for hot-carrier induced leakage. The below Table-5 provides a rough comparison between the index value "A" of equation Eq. 3a that was found for channel lengths in the range 0.5 μm to 0.70 μm.

$$I_{HCIL}=B\cdot(t_{PMU}-t_c)^A \text{ for } t_{PMU}>t_c \quad \text{(Eq. 3a)}$$

TABLE 5

| Device | $L_M$ | A |
|---|---|---|
| PMOS buried | .70 μm | 0.33 |
| PMOS buried | .65 μm | 0.44 |
| PMOS buried | .60 μm | 0.53 |
| PMOS surface | .55 μm | N/A |
| PMOS surface | .50 μm | 0.38 |
| PMOS surface | .45 μm | 0.50 |

It is seen from above Table-5 that the exponential rate "A" at which hot-carrier-induced leakage increases over time, tends to increase within a given technology as one moves to shorter and shorter channel lengths. This supports the negative power dependence of hot-carrier-induced leakage (HCIL) on channel length as given by above equation, Eq. 5a (A=M−N·L). Thus, $I_{HCIL}$ current leakage is expected to become more significant as designs move to shorter and shorter channel lengths. (And in the case of the surface channel device, forward HCIL becomes as important as reverse hot-carrier-induced leakage.)

The below Table-6 gives a prediction of the accumulated stress time needed to reach one picoampere per micron of channel width, 10 pA/μm, 100 pA/μm for the 0.50 μm surface channel PMOS transistor, given a stress voltage of $V_{Dstress}$=−5.5 V. The accumulated leakage current over a ten year period is calculated to be approximately 48 pA/μm at room temperature. This might be unacceptable for certain high density applications.

TABLE 6

| $I_{HCIL}$ pA per each micron of channel width ($L_M$ = .50 μm) | 1 pA/μm | 10 pA/μm | 100 pA/μm |
|---|---|---|---|
| $V_{Dstress}$ = −5.5V | 0.000376 year | 0.161 year | 68.76 years |

DIRECTION OF FUTURE EXPERIMENTS

The above experiments did not investigate the relationship between $I_{HCIL}$ relative to temperature and/or doping concentrations. It is expected that instantaneous leakage will increase with increased temperature but high temperature scattering of hot carriers may reduce the rate at which ions inject into the gate insulation layer. The above-cited work of Peng Fang et al, "A Method to Project Hot Carrier Induced Punchthrough Voltage Reduction for Deep Submicron LDD PMOS FETs at Room and Elevated Temperatures," supports this expectation.

It is expected that channel doping dose will have a significant effect on hot-carrier induced leakage. Experiments are now being planned to see how channel doping concentration and channel doping profile (e.g. lightly doped near drain) will alter the leakage characteristics.

It is further believed that the definition of polysilicon-gate width and gate oxide width by means of plasma etching has a detrimental effect on the ion trapping characteristics of the gate oxide. In particular, it is believed that plasma etching leaves loose (or "dangling" or "unsaturated") chemical bond sites in the chemo-physical composition of the gate oxide, and that such loose bond sites act as traps for hot-carrier induced gate current. Experiments are now being planned to see how plasma etching might be modified to lessen the density of charge trapping sites and/or to lessen the rate of charge trapping as represented by the "A" parameter of above equation, Eq. 2. The test fixture 300 of FIG. 3 is to be used to characterize insulated gate field effect transistors (IGFET's) having the same channel length and width but defined by plasma etch processes having different ionization settings (or other settings) to see which plasma etch parameters, if any, affect the "A" parameter of above equation, Eq. 2.

CONCLUSIONS REACHED FROM PRESENT RESULTS

It has been shown above that hot-carrier induced current leakage (HCIL) is more pronounced in the reverse mode rather than in the forward mode. (But forward mode becomes as significant as reverse mode for deep submicron surface channel devices.) Reverse mode leakage is expected in bidirectional switching devices such as pass transistors and CMOS transmission gates. Forward-only leakage is expected through transistors in the traditional PMOS inverter (a PMOS transistor in series with a resistive load) and in the conventional CMOS inverter (a PMOS transistor in series with an NMOS transistor). Thus, the unidirectional versus bidirectional nature of the switching function performed by a transistor will affect the amount of $I_{HCIL}$ current leakage expected over time will vary in accordance with the unidirectional or bidirectional function of the circuit in which the transistor resides.

It has been shown that HCIL leakage current has a power dependance on post-critical, accumulated stress time ($t_{PMU} - t_c$). Channel length plays a significant role in determining the rate at which leakage current increases over time. Accordingly, it may be advisable in some designs to vary channel length as an inverse function of the expected stress time for the device over the specified lifetime of the device. The drain voltage $V_{Dstress}$ has a less significant but similar affect on leakage current. In some designs it may be advisable to vary device channel length also as an inverse function of stress voltage, or vice versa.

USING THE ABOVE TEST FIXTURE AND TEST METHOD IN A DEVICE DESIGN AND IMPLEMENTATION PROCESS

Computer simulation is becoming commonplace in the design/implementation process. Design parameters are adjusted within a simulation environment until desired results are obtained with that environment. The resulting design is then implemented physically as an integrated circuit chip or other physical implementation.

Examples of software simulation packages include HSpice™ available from Meta-Software, Inc. of Campbell, Calif., or other "Spice" type circuit simulators that are common in the industry; the BeTABeRT™ reliability tool package available from Berkeley Technology Associates (BETA) of Santa Clara, Calif.; design rule checkers available for example from Cadence or Mentor; and device simulators and circuit simulators available for example from Silvaco of Santa Clara, Calif., or TMA of California.

Figure 11A:
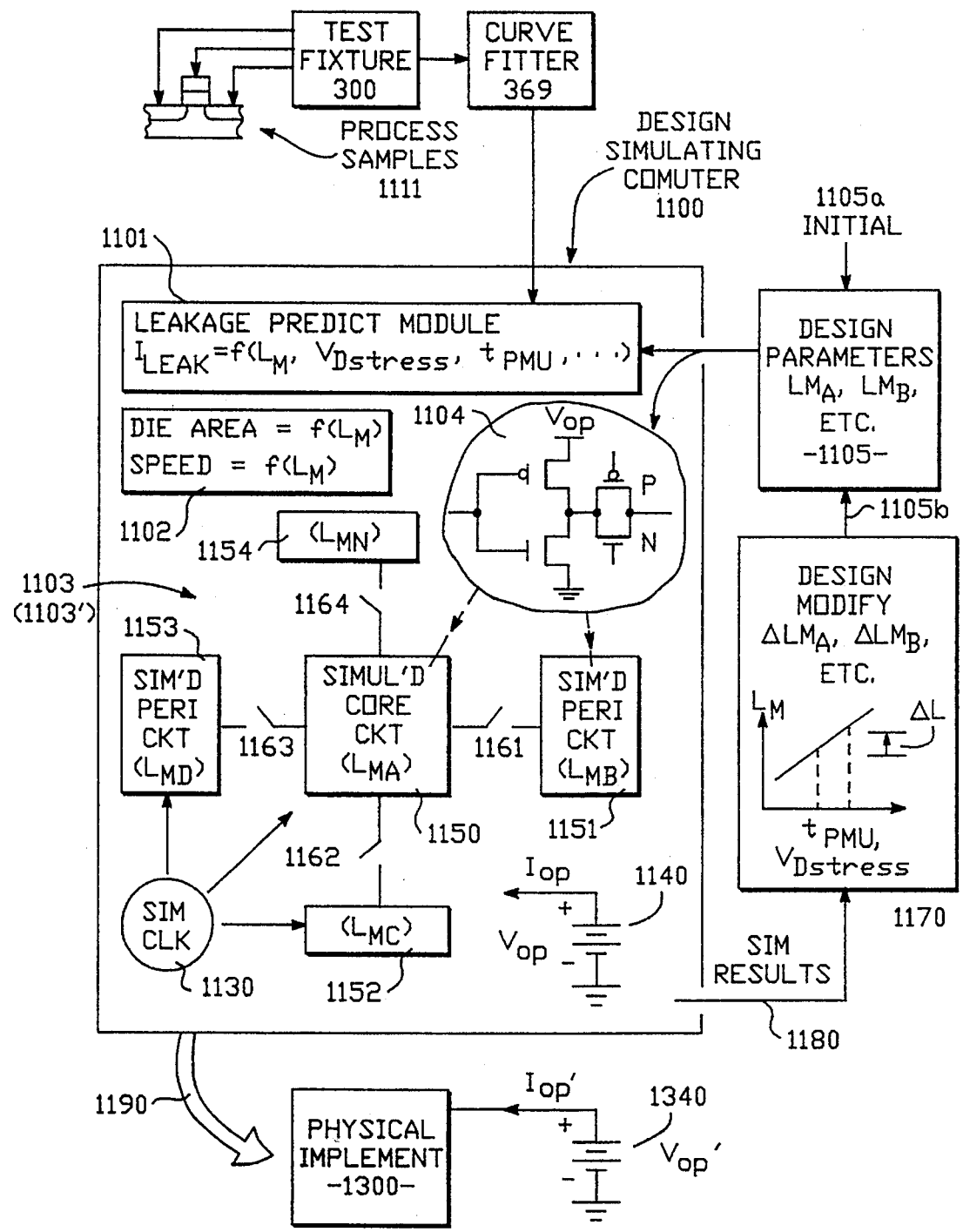
FIG. 11A illustrates a design and implementation method for keeping leakage below a prespecified maximum over a specified lifetime.

FIG. 11A shows how the present invention may be exploited within a computerized design and implementation process. Test fixture 300 is used to define within the memory of a design-defining and design-simulating computer 1100, a leakage predicting module 1101 that conforms to leakage tests performed on process samples 1111. Process samples 1111 are produced by a fabrication process that is to be later used in implementing (1190) a design (1103') defined within computer 1100.

As shown, the leakage predicting module 1101 predicts $I_{LEAK}$ as a function of device channel length $L_M$, stress voltage $V_{Dstress}$, accumulated stress time $t_{PMU}$, and/or other parameters (e.g., temperature, doping concentrations, reverse or forward switching orientation). Initial design parameters 1105a or modified design parameters 1105b that define process parameters such device channel length $L_M$ and doping concentrations are supplied to the leakage predicting module 1101 from a design parameter defining module 1105.

For "Spice" type simulators (e.g., HSpice™), the leakage predicting module 1101 can be introduced as two parallel current sources placed across the source and drain terminals of each IGFET. A first of the two current sources will generate the intrinsic leakage portion, $I_{INT}$, of above equation Eq. 1 as a function of temperature, drain-to-source voltage and other relevant parameters. The second of the two current sources will generate the hot-carrier-induced leakage portion, $I_{HCIL}$, of above equation Eq. 1 as a function of post-manufacture utilization time $t_{PMU}$, manufactured channel length $L_M$, $V_{Dstress}$, and any other relevant parameter as discussed above.

A simulated circuit 1103, is defined within a memory of the design-defining and design-simulating computer 1100 in accordance with the design parameters 1105a or 1105b supplied by design parameter defining module 1105. The definition 1103 of the simulated circuit includes a list of components and a netlist (not shown) defining connections among those components. The circuit definition 1103 is operatively coupled to the leakage predicting module 1101 in a manner which allows the leakage predicting module 1101 to predict leakage over time through various portions of the simulated circuit 1103 based not only on fabrication process parameters but also on other parameters such as stress voltage $V_{Dstress}$, accumulated stress time $t_{PMU}$, and switching function (unidirectional or bidirectional).

A size/performance calculating module 1102 is further defined within the design defining/simulating computer 1100 for calculating the amount of die area to be consumed by a physical implementation (1300) of the simulated circuit 1103 given a present setting of manufactured channel length $L_M$ and a corresponding layout. The size/performance calculating module 1102 will typically also calculate other system attributes that are dependent on the present setting of manufactured channel length $L_M$, such as signal propagation time.

The simulated circuit 1103 is driven by a simulation clock 1130 and conceptually powered by a simulated power supply 1140. The simulation 1140 of the power supply includes means for defining an operational voltage $V_{op}$ provided by that supply 1140 to the remainder of the simulated circuit 1103 and also means for determining the amount of simulated current $I_{op}$ drawn out of the supply 1140 by the remainder of the simulated circuit 1103.

The simulated circuit 1103 is partitioned into a plurality of N+1 circuit sections 1150, 1151, . . . , 1154, where N is a selected integer greater than one. The circuit sections are identified as containing either core operating circuits (1150) or peripheral circuits (1151–1154). Core circuits such as found in the illustrated core section 1150 are defined as those which are expected to remain in a non-standby operating mode for substantially the entire operating lifetime of a physical implementation (1300) of the simulated circuit 1103. Transistors in the core-containing circuit section 1150 are assigned a first channel length value, $L_{MA}$.

Peripheral circuit sections 1151–1154 are defined as those which are expected to enter into a low-power standby mode for some significant portion of the specified operating lifetime of the physical implementation (1300) so as to reduce the amount of current $I_{op}$ drawn from the supply 1140. Each circuit section containing a simulated peripheral circuit, 1151, 1152, etc., can have an independent and respective standby mode which is activated or not in accordance with the needs of the simulated core circuits 1150. Transistors in the respective peripheral circuit sections 1151–1154 are assigned corresponding second to Nth channel length values, $L_{MB}, L_{MC}, \ldots, L_{MN}$, any of which can be the same or different from the channel length value, $L_{MA}$ assigned to the core section 1150.

Standby control switches 1161–1164 are shown in FIG. 11A for operatively coupling core circuit section 1150 to respective peripheral circuit sections 1151–1154 and for deactivating the peripheral circuit sections 1151–1154 when they are not being used. The standby control switches 1161–1164 represent the means by which the core circuit section 1150 independently instructs each of the peripheral circuit sections 1151–1154 to enter into either a low-power standby mode or an operational mode which consumes more power.

The terms "core" and "peripheral" are used here to define a logical relationship as opposed to a physical relationship. It is noted however, that the logical core versus peripheral relationship is often translated into a like physical relationship when the physical implementation 1300 of simulated circuit 1103 is fabricated (step 1190). It is often found advantageous to physically position the logically-related core and peripheral circuits respectively at the physical core and physical periphery of the physical implementation 1300 in order to minimize signal propagation time between such cross-communicating circuits.

Modern high-performance, power-frugal microprocessors such as the Am386SL™ serve as examples of systems that have a continuously-operating "core" operating portion which cannot be placed in standby mode, and other "peripheral" portions which do not have to operate continuously and may therefore be placed into a low-power standby or "sleep" mode when not needed in order to conserve power consumption from the power supply. The core portion may include an interrupt servicing unit which has to always be ready to immediately respond to incoming interrupt signals. The peripheral portions may include, by way of example, an infrequently-used communications module for communicating with off-chip peripheral devices (e.g., a modem) or an infrequently-used floating-point arithmetic unit which is activated only when floating-point operations are to be carried out. It is advantageous to place such infrequently-used peripheral units in low-power standby mode when their resources are not required by the central control circuit.

Simulated circuit 1103 also includes forward/reverse switch function defining variables 1104 for defining the switching function of various switches within circuit 1103 as being either unidirectional or bidirectional. The leakage predicting module 1101 is made responsive to the unidirectional or bidirectional function or each simulated switching device.

The simulation system of FIG. 11A is used in accordance with the invention to predict the long term leakage current characteristics of circuit 1103. Simulation clock 1130 is turned on and operations of circuit 1103 are simulated while the leakage predicting module 1101 continuously tracks the amount of stress applied to each switching device (PMOS transistor or NMOS transistor) and continuously updates the expected leakage of each switching device as a function of its assigned channel length $L_{MA}$–$L_{MN}$ and the stress voltage to which it is subjected $V_{Dstress}$ and the accumulated utilization time $t_{PMU}$ during which the device is subject to the stress condition.

A simulated run of device performance over the specified lifetime (e.g., 5–10 years) for the physical implementation 1300 is made to see whether leakage current will exceed allowances over the specified lifetime of the device 1300. A record is kept of the accumulated stress time $t_{PMU}$ for each circuit section 1150 or 1151–1154.

If at the end of the simulation experiment, it is found that simulated leakage current is within the allowed range even at the end of the specified device lifetime, one can have a sound basis for predicting and making assurances that the implemented device 1300 will be within specifications even at the end of its lifetime.

If, on the other hand, it is found at the end of the simulation experiment that leakage current is excessive, the current drawn by each subcomponent is reviewed and the design of simulated circuit 1103 is interactively modified as indicated at 1170 to reduce power consumption in those subcomponents that contribute to the excessive consumption.

It is expected that channel length tuning will be a primary form of control for limiting HCIL current leakage over the specified lifetime of a physical implementation 1300. The channel length $L_{MA}$–$L_{MN}$ assigned to each of the core and peripheral circuit sections 1150–1154 is tuned such that die area consumption (as calculated by module 1102) does not exceed a prespecified maximum and such that total leakage (as predicted by module 1101) also does not exceed a lifetime maximum.

Preferably, if a first simulation shows excessive leakage, the assigned channel length $L_{MA}$ of a core circuit section such as 1150 will be increased in order to reduce HCIL leakage current. This may, of course, change the circuit layout and increase the die area consumed by the core circuit section 1150. But it should produce significant reductions in long-term leakage current because core circuit sections such as 1150 have the greatest post-manufacture utilization time $t_{PMU}$ over the designated lifetime of the device and are thus most prone to developing excessive leakage currents.

It may be possible to decrease the channel lengths $L_{MB}$–$L_{MN}$ assigned to one or more of the peripheral circuit sections 1151–1154 in order to decrease the die area consumed by the peripheral circuit sections 1151–1154 and thereby compensate for the increased channel length $L_{MA}$ of a core circuit section 1150. This should produce a substantially smaller increase in long-term leakage current because the peripheral circuit sections 1151–1154 have substantially smaller post-manufacture accumulated utilization times $t_{PMU}$ as compared to that of the core circuit section 1150. The increased die-area of the core circuit section 1150 is offset by the reduced die area (calculated by unit 1102) of the peripheral circuit sections 1151–1154 so that overall die area remains relatively stable.

Simulation experiments 1180 and design modifications 1170 based on the results of the experiments 1180 are repeated until an appropriate balance is struck between the standby leakage allowed over the lifetime of the physical implementation 1300 and other requirements of the design 1103 (e.g., speed).

It is to be observed that channel length tuning is not the only mechanism by which the specified lifetime leakage of the device can be reduced. Circuit operations can be modified so that the accumulated stress time $t_{PMU}$ is reduced in critical circuit sections in order to reduce end-of-lifetime leakage. Also, the stress conditions to which switching devices are subject during their conductive state can be modified to reduce the number of trapped charge particles 16e (FIG. 1C) which accumulate in the gate insulating layers (14) over the lifetime of the physical implementation 1300. Moreover, circuit design in critical areas may be modified from a bidirectional switching modality to a unidirectional switching modality in order to avoid the penalty of reverse mode leakage.

Once simulation design 1103 has been appropriately modified to meet lifetime leakage requirements and other requirements, the optimized design 1103' is converted into a physical implementation 1300 by fabrication step 1190. Physical implementation 1300 is typically a single integrated circuit chip. It is not outside the contemplation of the invention, however, to produce a physical implementation 1300 which is a multi-chip system that is modeled by the design defining/simulating computer 1100. A timing simulator such as L-Sim™ available from Mentor may be modified to model large-sized systems.

If the physical implementation 1300 of optimized design 1103' is fabricated 1190 with a process that is the same or substantially similar to the process that is used for fabricating process samples 1111, then the end product implementation 1300 should reliably conform to the lifetime leakage predictions made by predicting module 1101. This, of course, assumes that a substantially similar operating environment is used for the physical implementation 1300 as was simulated for the simulated circuit 1103 (e.g., the voltage of physical supply 1340 should be substantially the same as that of the simulated supply 1140).

As such, FIG. 11A presents a methodology for incorporating into the design 1103' of a physical unit 1300 appropriate parameters for reliably limiting the power consumption of the physical implementation 1300 over a specified lifetime (e.g. 5 to 10 years).

Figure 11B:
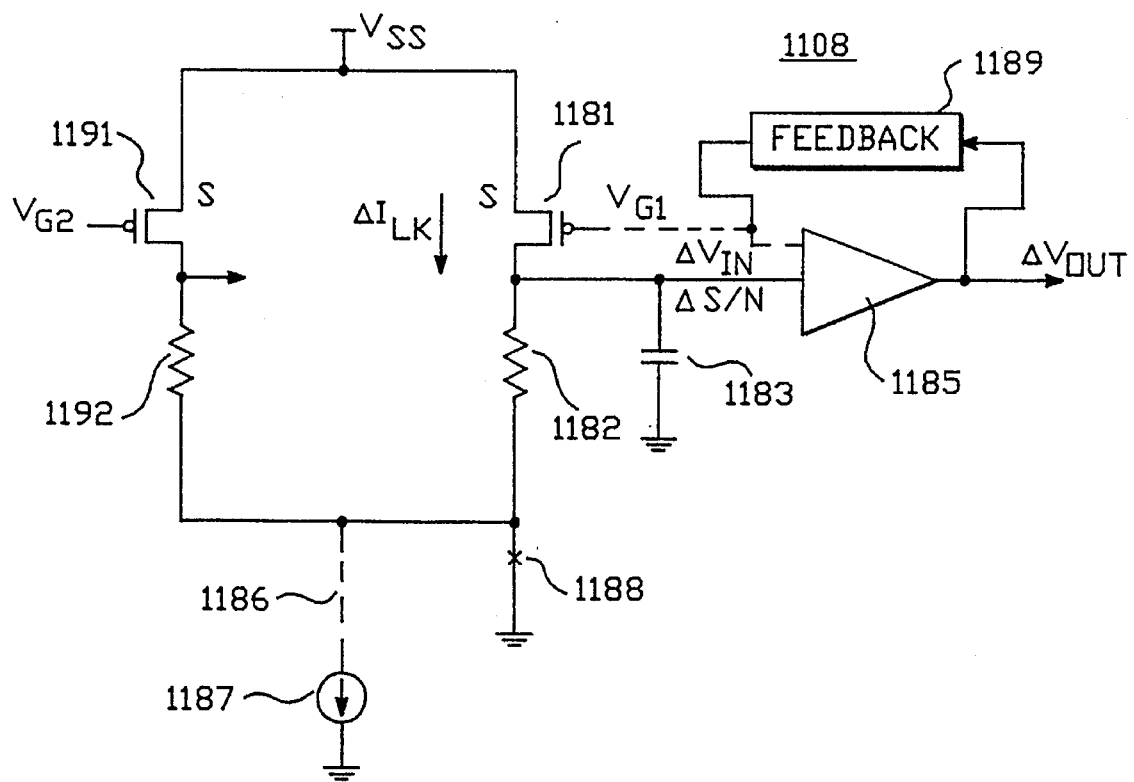
FIG. 11B is a schematic for explaining how an increase of leakage current over time can cause a circuit incorporating an insulated gate device to become functionally inoperative or degrade its performance.

Excessive leakage current can affect the functional operation of a circuit in addition to or as an alternative to affecting its power consumption. FIG. 11B shows an exemplary circuit 1108 in which leakage current $I_{LK}$ through a first PMOS transistor 1181 flows into a current-to-voltage converting means such as resistor 1182 or capacitor 1183 and thereby applies a functional voltage level $V_{in}$ to the input of a subsequent, voltage-sensitive unit 1185. The voltage sensitive unit 1185 can be a digital gate circuit which switches state when its input voltage $V_{in}$ crosses a predefined threshold. Alternatively, the voltage-sensitive unit 1185 may be an analog circuit whose output level is a linear or nonlinear function of the applied input voltage $V_{in}$. In one variation, a feedback circuit 1189 responds to the output $V_{out}$ of the voltage-sensitive unit 1185 and returns a corresponding feedback signal to either transistor 1181 or to an input of unit 1185.

In either case (digital or analog; feedback or no feedback), an over-time change $\Delta I_{LK}$ in the leakage current of transistor 1181 tends to produce a corresponding over-time change $\Delta V_{in}$ in the output of the current-to-voltage converting means (1182, 1183). If $\Delta I_{LK}$ becomes sufficiently large over time, it may produce an undesirable change over-time in the output of the voltage-sensitive unit 1185. In the case where unit 1185 is a digital gate, the excessive leakage through transistor 1181 may shift the input voltage $V_{in}$ across a threshold point and cause unit 1185 to output a digital signal other than the one originally specified by the digital design. In the case where unit 1185 is an analog circuit, the excessive leakage through transistor 1181 may produce an undesired offset in the output $V_{out}$ of voltage-sensitive unit 1185. In the case where feedback circuit 1189 is present, the over-time change $\Delta V_{in}$ in the output of the current-to-voltage converting means (1182, 1183) may lead to an undesirable change in the output of the feedback circuit 1189, and the latter change can lead to functional inoperativeness or performance impairment.

Excessive leakage through transistor 1181 can result from hot-carrier induced leakage (HCIL), which leakage increases over time due to post-manufacture utilization of transistor 1181. Simulation in the simulator of FIG. 11A can identify subcircuits in which leakage current becomes excessive for purposes of functional correctness even though leakage current may not be excessive for purposes of overall power consumption. When such a condition is found, it may be necessary to modify the design of transistor 1181 or to modify the design of the current-to-voltage converting means (1182, 1183), by for example, reducing the resistance of resistor 1182. Alternatively, the channel length of transistor 1181 may be increased as suggested by block 1170, and/or the post-manufacture utilization time $t_{PMU}$ of transistor 1181 may be reduced to thereby reduce the maximum leakage current over the lifetime of the device.

FIG. 11B is used to describe several scenarios in which an over-time increase of leakage current can lead to an error in the functional operation of the circuit or an impairment of its performance. In one such case, the bottom of resistor 1182 ties to ground and dashed connection 1186 is not made. In such a case, the combination of PMOS transistor 1181 and resistor 1182 defines either a digital inverter circuit or an analog amplifier circuit. When the gate voltage $V_{G1}$ is raised to the source level $V_{ss}$, transistor 1181 should switch into a non-conductive off-state and resistor 1182 should then discharge capacitor 1183 down to the ground level. However, if transistor 1181 is maintained in a conductive stress state over a relatively long post-manufacture accumulated stress time ($t_{PMU}$), then hot carrier induced leakage will increase through transistor 1181 and produce a change in the leakage current $I_{LK}$. The change $\Delta I_{LK}$ in leakage current can detrimentally reduce the noise immunity of the circuit 1108 or undesirably change its functional operation.

A less apparent, but noteworthy, other circuit 1108' in which the increase of leakage current may become a problem is the case where dashed connection 1186 is made to current source 1187 and a cut is made at 1188. PMOS transistor 1191 and resistor 1192 combine with, initially-matched, transistor 1181 and resistor 1182, and current source 1187 to define a differential amplifying circuit. Ideally, transistor 1191 is functionally identical to transistor 1181 over the specified lifetime of the circuit. Similarly, resistor 1192 is functionally identical to resistor 1182. Thus, when the gate voltage $V_{G2}$ of transistor 1191 matches the gate voltage $V_{G1}$ of transistor 1181 a null difference develops between the drains of transistors 1191 and 1181. In some circuits, the precision of this null output is important.

If it turns out, however, that transistor 1181 is subjected to stress for longer accumulated time periods than transistor 1191, the leakage current $I_{LK}$ through transistor 1181 will become higher than the corresponding leakage current through transistor 1191 and the symmetry of the circuit will be destroyed. A modeling and simulation system such as shown in FIG. 11A can be used to identify such a non-obvious defect in the design of the circuit 1108'. The modeling and simulation system of FIG. 11A can be used to also identify other similar, but non-apparent defects and to find design strategies which over come them. One solution to the non-symmetry problem of transistors 1181 and 1191 might be to intentionally stress transistor 1191 during times when the output of the differential amplifier 1191/1181 is not being used so that the post-manufacture accumulated stress time of transistor 1191 matches that of transistor 1181.

Aside from creating functional inoperativeness, increased leakage current can also produced performance degradation in circuits. By way of example, consider what happens in the case where circuit 1108 is an analog amplifier circuit and leakage current $I_{LK}$ through either or both of transistors 1181 and 1191 increases over time. The increased leakage current can reduce noise immunity or it can insert shot noise or other noise into the output signal. This in turn, reduces the signal to noise ratio S/N of circuit 1108.

Certain applications require a minimum signal noise ratio, S/N. In such cases, it is beneficial to further add to the simulating environment of FIG. 11A, a noise predicting module (not shown) which predicts noise or signal-to-noise ratio (S/N) as a function of leakage current. Then, when noise in a particular circuit section (e.g. 1153 of FIG. 11) is found to become a problem, due to excessive leakage current; the leakage-current reducing modifications suggested at 1170 can be carried out so as to bring the S/N ratio of the noise sensitive circuit into line with the performance criteria required over the lifetime of the product.

Figure 12:
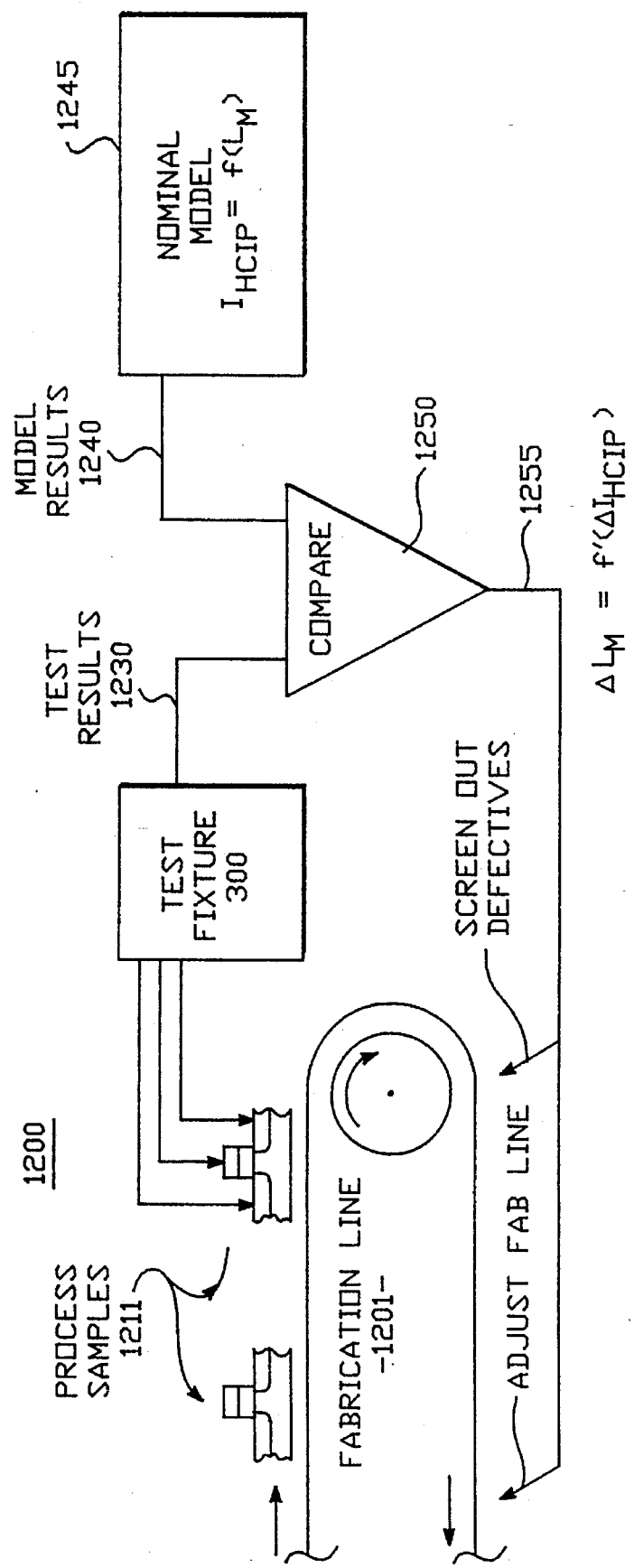
FIG. 12 shows a fabrication process monitoring/correction system in accordance with the invention.

Referring to FIG. 12, test fixture 300 can also be used as part of a system 1200 for monitoring fabrication line deviations and adjusting the fabrication line when deviations exceed an allowed tolerance. Process samples 1211 are tested by test fixture 300 as the process samples 1211 move through a mass production fabrication line 1201. Leakage test results 1230 are compared against model results 1240 where the model results 1240 are based on a nominal channel length $L_M$ and other nominal process parameters. A comparing unit 1250 compares the fitted curves of the $I_{LEAK}$ versus post-manufacture utilization time $t_{PMU}$ of the test results 1230 against model results 1240 provided by a nominal model 1245. Because the fixture results 1230 are very sensitive to changes in the channel length of the process samples 1211, the comparison results 1255 provide a very sensitive indication of variations in the channel length being actually produced on the fabrication line. The difference between the actually produced channel length and the nominal channel length can be expressed by below equation Eq. 10:

$$\Delta L_M = f(\Delta I_{HCIL}, t_{PMU}) \quad \text{(Eq. 10)}$$

where $\Delta I_{HCIL}$ is the observed difference between measured and expected leakage current and $t_{PMU}$ is the common test time. Inverse function f'( ) represents the differential of the inverse of the function for finding $I_{HCIL}$ given a value for $L_M$ as expressed in below Eq. 5c'.

$$I_{HCIL} = f(L) = J' e^{(-K'L)} (t_{PMU} - t_c)^{[M-N \cdot L]} \ldots \text{ for } t_{PMU} > t_c \quad \text{(Eq. 5c')}$$

If the difference between the actually produced channel length and the nominal channel length, as defined by above Eq. 10 is found to be excessive, defective products can be screened out, and/or lithography or other appropriate fabrication steps (e.g., doping times and concentrations) can be adjusted in closed-loop fashion so that the resulting end products will reliably meet the specified lifetime performance criteria.

The fabrication monitoring components, 300, 1245 and 1250 of FIG. 12 can be incorporated into programmable test fixture hardware and software such as the MIRA™ package available from Qualitau Inc. of California. Programmable testers such as available from Micron Instrument of Escondido, Calif., or Sienna of St. Paul, Minn., or Keithely may be used.

The above disclosure is to be taken as illustrative of the invention, not as limiting its scope or spirit. Numerous modifications and variations will become apparent to those skilled in the art after studying the above disclosure. By way of example, the test method can be applied to NMOS transistors as well as PMOS transistors. Multi-gate devices or multi-transistor switching systems may be subjected to alternating stress and leakage measurement states in a manner similar to that described for the three-terminal PMOS transistor 10. The simulation of FIG. 11 may be applied for hybrid digital and analog circuits to detect detrimental effects in such hybrid circuits as well as being applied to all-digital or all-analog circuits.

In terms of a second summary of the above disclosure, the following points are to be noted:

(A) A methodology has been presented for determining how small the manufactured channel length $L_M$ of an insulated gate device that is fabricated with a given fabrication technology can be made before hot-carrier-induced leakage (HCIL) becomes excessive at the end of the specified lifetime of the device.

(B) A nondestructive, and thus fairly representative, test procedure has been provided for characterizing the hot-carrier-induced leakage (HCIL) properties over post-manufacture utilization time ($t_{PMU}$) for an insulated gate device that is fabricated with a given fabrication technology and for understanding how the selection of fabrication parameters such as manufactured channel length ($L_M$) or channel doping affect HCIL. The test procedure also indicates how the selection of post-manufacture, utilization parameters such as $V_{Dstress}$ and accumulated post-manufacture utilization time $t_{PMU}$ affect hot-carrier-induced leakage (HCIL).

(C) A methodology has been presented for modifying fabrication parameters such as manufactured channel length ($L_M$) or channel doping and/or modifying post-manufacture utilization parameters such as $V_{Dstress}$ and $t_{PMU}$ so as to provide designed-in assurance that hot-carrier-induced leakage (HCIL) will not become excessive at the end of the specified lifetime of the device.

(D) A methodology has been presented for modifying Spice or other simulation and/or test software to take advantage of the above discoveries and give fabrication-process designers and circuit designers a potent tool for designing products having designed-in reliability and monitoring fabrication lines to better assure that the physical-implementations of the design will be reliable.

Given the above disclosure of general concepts and specific embodiments, the scope of protection sought is to be defined by the claims appended hereto.

What is claimed is:

1. A product of a design and implementation process, the product having an electronic circuit composed of a plurality of insulated gate field effect devices each with a respective channel length defined by said design and implementation process, the design and implementation process comprising the steps of:

(a) specifying an operational environment in which the product will be used and a desired operational lifetime for the product;

(b) specifying one or more amounts of maximum leakage current allowed in the whole or one or more parts of the product over the desired specified operational lifetime of the product;

(c) specifying a fabrication technology by which the plural insulated gate field effect devices of the product will be fabricated;

(d) using the specified fabrication technology to fabricate a set of sample insulated gate field effect devices having respective and different, manufactured channel lengths ($L_{M1} > L_{M2} > L_{M3} > \ldots$ etc.);

(e) stressing the set of sample insulated gate field effect devices each with a same stress environment and nondestructively measuring leakage current through the stressed devices at plural points of accumulated stress time to characterize hot-carrier-induced leakage (HCIL) through each sample device as a function of manufactured channel length ($L_M$) and accumulated post-manufacture stress time ($t_{PMU}$);

(f) assigning an initial manufactured channel length ($L_{MA}$–$L_{MN}$) to each insulated gate field effect device that is to be included in the electronic circuit;

(g) modeling the electronic circuit and the specified operational environment of the product to determine the stress condition and post-manufacture accumulated stress time ($t_{PMU}$) that each insulated gate field effect device of the product will be subject to over the specified operational lifetime for the product;

(h) using the characterization developed in step (d) to determine the amount of hot-carrier-induced leakage current (HCIL) that will flow through each modeled device of the modeled electronic circuit as a function of its assigned channel length ($L_M$) and modeled post-manufacture utilization time ($t_{PMU}$);

(i) determining whether leakage current of the modeled product, including said determined amount of hot-carrier-induced leakage current (HCIL), will exceed the specified one or more, corresponding amounts of maximum leakage current allowed in the product over the desired specified operational lifetime of the product; and (j) if the result of determination step (i) is no, fabricating the product by means of the specified fabrication technology using the assigned channel length ($L_{MA}$–$L_{MN}$) of each insulated gate field effect device as its manufactured channel length.

2. A product of a design and implementation process according to claim 1 wherein the design and implementation process further comprises the steps of:

(k) if the result of determination step (i) is yes, assigning modified manufactured channel length ($L'_{MA}$–$L'_{MN}$) to each insulated gate field effect device that is to be included in the electronic circuit; and (l) repeating steps (g), (h), (i) and (k) until the result of determination step (i) is no, and then performing implementation step (j) using the modified, assigned channel lengths ($L_{MA}$–$L_{MN}$) which resulted in determination step (i) showing that leakage current of the modeled product, including said determined amount of hot-carrier-induced leakage current (HCIL), will not exceed the, specified one or more amounts of maximum leakage current allowed in the product over the desired specified operational lifetime of the product.

3. A product of a design and implementation process according to claim 2 wherein the design and implementation process further comprises within the channel length modification step (k) the internal steps of:

(k.1) identifying which of the modeled insulated gate field effect devices have relatively large post-manufacture utilization times ($t_{PMU}$) and which, if any, have substantially smaller post-manufacture utilization times ($t_{PMU}$); and (k.2) increasing the assigned channel lengths ($L_{MA}$–$L_{MN}$) of modeled insulated gate field effect devices that are identified as having the relatively large post-manufacture utilization times ($t_{PMU}$).

4. A product of a design and implementation process according to claim 3 wherein the design and implementation process further comprises within the channel length modification step (k) the internal step of:

(k.3) decreasing the assigned channel lengths ($L_{MA}$–$L_{MN}$) of modeled insulated gate field effect devices that are identified as having said substantially smaller post-manufacture utilization times ($t_{PMU}$).

5. A product of a design and implementation process according to claim 4 wherein the design and implementation process further comprises after the channel length modification step (k) the step of:

(m) determining the size of the to-be-implemented electronic circuit if the currently assigned channel lengths ($L_{MA}$–$L_{MN}$) of modeled insulated gate field effect devices are used; and (n) if the size determined by step (m) exceeds a prespecified maximum, further decreasing the assigned channel lengths ($L_{MA}$–$L_{MN}$) of modeled insulated gate field effect devices that are identified in step (k.1) as having said substantially smaller post-manufacture accumulated-stress times ($t_{PMU}$).

6. A product of a design and implementation process according to claim 5 wherein the design and implementation process further comprises after the channel length modification step (k) the step of:

(o) determining the operational speed of the to-be-implemented electronic circuit if the currently assigned channel lengths ($L_{MA}$–$L_{MN}$) of modeled insulated gate field effect devices are used; and (p) if the speed determined by step (o) is less than a prespecified minimum speed, identifying and decreasing the assigned channel lengths ($L_{MA}$–$L_{MN}$) of modeled insulated gate field effect devices that are primarily responsible for the sub-minimum speed.

7. A product of a design and implementation process according to claim 1 wherein the design and implementation process comprises in addition to the stress and characterize step (e) that uses a same stress environment for each sample device, the step of:

(e.1) nondestructively and periodically measuring leakage current through the set of sample insulated gate field effect devices while periodically stressing each with a different stress environment to thereby characterize hot-carrier-induced leakage (HCIL) through each sample device as a function of applied stress voltage and post-manufacture utilization time ($t_{PMU}$).

8. A product of a design and implementation process according to claim 7 wherein the design and implementation process comprises, in furtherance of stress, measure and characterize steps (e) and (e.1), the step of:

(e.2) modeling hot-carrier-induced leakage through the use of the following approximating equations:

$$\log (I_{HCIL}) = A \cdot \log (t_{PMU} - t_c) + \log (B) \ldots \text{ for } t_{PMU} > t_c \quad \text{(Eq. 2)}$$

$$I_{HCIL} = 0 \text{ for } t_{PMU} \leq t_c \quad \text{(Eq. 3b)}$$

$$A = M - N \cdot L \quad \text{(Eq. 5a)}$$

$$\log (B) = J - K \cdot L \quad \text{(Eq. 5b)}$$

$$t_c = Q e^{-[R \cdot L - S \cdot V_{Dstress}]} \quad \text{(Eq. 7)}$$

where L is the assigned channel length of a given sample device and J, K, M, N, Q, R, S are characterization constants determined by said stress and characterize steps (e) and (e.1), and $V_{Dstress}$ is a drain to source voltage applied across the sample devices while they are under stress.

9. A product of a design and implementation process according to claim 1 wherein the electronic circuit is implemented on one or more integrated circuit chips and at least a subset of the insulated gate field effect devices are formed on a common integrated circuit chip with manufactured channel lengths of less than one micron.

10. A product of process according to claim 9 wherein each of the insulated gate field effect devices of the common chip has a manufactured channel length approximately equal to or less than half a micron.

11. A product of process according to claim 9 wherein each of the insulated gate field effect devices of the common chip is a surface channel device.

12. A product of process according to claim 9 wherein the product is to be powered by a battery.

13. A product of process according to claim 9 wherein the product is a mobile product designed to be hand-carried or transported by a vehicle.

14. A product of process according to claim 9 wherein a predefined functional operation of the product becomes nonoperative or impaired if leakage current through a corresponding one or more parts exceeds the specified and corresponding one or more amounts of maximum leakage current allowed.

15. A fabrication line monitoring system for monitoring a mass production fabrication line that produces a plurality of insulated gate field effect devices each having a manufactured channel length, the fabrication line monitoring system comprising:

nominal model means for defining a nominal rate at which hot-carrier-induced leakage (HCIL) develops in a nominal insulated gate field effect device having a nominal channel length as a function of post-manufacture utilization time;

fabrication testing and characterizing means; operatively coupled to the mass production fabrication line, for placing sample insulated gate field effect devices output by the fabrication line under post-manufacture utilization stress for a sufficient length of time ($t_{PMU}$) to characterize a rate at which hot-carrier-induced leakage (HCIL) develops in the sample insulated gate field effect devices as a function of post-manufacture utilization time; and comparing means, operatively coupled to characterization outputs of the nominal model means and the fabrication testing and characterizing means, for comparing said characterization outputs and indicating by said comparison, a deviation between the nominal channel length and the actual, manufactured channel length of each sample insulated gate field effect devices output by the fabrication line.

16. A fabrication line monitoring system according to claim 15 wherein the comparing means determines the difference between the actually produced channel length and the nominal channel length by using the equation:

$$\Delta L_M = f'(\Delta I_{HCIL}, t_{PMU}) \quad \text{(Eq. 10)}$$

where $\Delta I_{HCIL}$ is the observed difference between measured leakage current as measured by the fabrication testing and characterizing means and expected leakage current as predicted by the nominal model means for the common test time, $t_{PMU}$, and inverse function f'( ) represents the differential of the inverse of a predefined function f( ) for finding hot-carrier-induced leakage current $I_{HCIL}$ given a value for manufactured channel length $L_M$.

17. A fabrication line correcting system dependent of the monitoring system of claim 16, said correcting system including:

feedback means for feeding a signal representative of said channel length difference to an upstream part of the fabrication line; and process adjustment means, located at an upstream part of the line and responsive to the feedback signal, for adjusting an adjustable process parameter that controls channel length to reduce the difference in channel length of subsequent samples.

18. The system of claim 16 wherein the adjustable parameter is selected from the group consisting of: drawn channel length, photoresist composition, mask development time, and dopant introduction time and dopant drive-in time.

19. A fabrication line monitoring system according to claim 16 wherein the predefined function f( ) for finding hot-carrier-induced leakage current $I_{HCIL}$ is expressed as:

$$I_{HCIL} = f(L) = J' e^{(-K \cdot L)} (t_{PMU} - t_c)^{[M - N \cdot L]} \ldots \text{ for } t_{PMU} > t_c \quad \text{(Eq. 5c')}.$$

* * * * *

UNITED STATES PATENT AND TRADEMARK OFFICE
CERTIFICATE OF CORRECTION

PATENT NO. : 5,606,518
DATED : February 25, 1997
INVENTOR(S) : Hao Fang et al.

It is certified that error appears in the above-indentified patent and that said Letters Patent is hereby corrected as shown below:

Column 2, line 12, "$\leq$" should be --$\geq$--.
Column 12, line 26, "3.6 V 5.5 V" should be --3.6 V to 5.5 V--.
Column 29, line 54, Eq. 10 should read --$\Delta L_M = f'(\Delta I_{HCIL}, t_{PMU})$--;
          line 57, "function f()" should be --f'()--.
Column 34, line 21, Eq. 10 should read --$\Delta L_M = f'(\Delta I_{HCIL}, t_{PMU})$--.
          line 27, "function f()" should be --f'()--.
          line 42, "claim 16" should be --claim 17--.
          line 51, Eq. 5c' should read:

$$--I_{HCIL} = f(L) = J'e^{[-K'L]}(t_{PMU} - t_c)^{[M-N \cdot L]}$$
$$\ldots\ldots \text{for } t_{PMU} > t_c--.$$

Signed and Sealed this

Fifth Day of August, 1997

Attest:

Attesting Officer

BRUCE LEHMAN

Commissioner of Patents and Trademarks